(12) United States Patent
Lee et al.

(10) Patent No.: US 11,270,885 B2
(45) Date of Patent: Mar. 8, 2022

(54) METHOD OF FORMING PATTERNS, INTEGRATED CIRCUIT DEVICE, AND METHOD OF MANUFACTURING THE INTEGRATED CIRCUIT DEVICE

(71) Applicant: Samsung Electronics Co., Ltd., Suwon-si (KR)

(72) Inventors: Dongjun Lee, Anyang-si (KR); Keunnam Kim, Yongin-si (KR); Daehyoun Kim, Hwaseong-si (KR); Taejin Park, Yongin-si (KR); Sunghee Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 128 days.

(21) Appl. No.: 16/776,948

(22) Filed: Jan. 30, 2020

(65) Prior Publication Data

US 2020/0411318 A1    Dec. 31, 2020

(30) Foreign Application Priority Data

Jun. 26, 2019  (KR) .......................... 10-2019-0076683

(51) Int. Cl.
*H01L 21/033* (2006.01)
*H01L 21/027* (2006.01)
*H01L 21/768* (2006.01)
*H01L 21/311* (2006.01)

(52) U.S. Cl.
CPC ...... *H01L 21/0337* (2013.01); *H01L 21/0273* (2013.01); *H01L 21/31144* (2013.01); *H01L 21/76816* (2013.01)

(58) Field of Classification Search
CPC ......... H01L 21/76816; H01L 21/31144; H01L 21/0337; H01L 21/0338; H01L 21/0273
See application file for complete search history.

(56) References Cited

U.S. PATENT DOCUMENTS

| | | | |
|---|---|---|---|
| 7,994,056 B2 | 8/2011 | Shin et al. | |
| 8,110,506 B2 | 2/2012 | Min et al. | |
| 8,158,333 B2 | 4/2012 | Hashimoto | |
| 8,435,876 B2 | 5/2013 | Park et al. | |
| 10,224,213 B2 | 3/2019 | Byun et al. | |
| 2016/0155662 A1* | 6/2016 | Lee | H01L 21/76897 438/668 |
| 2017/0148643 A1* | 5/2017 | Ham | H01L 21/0337 |

FOREIGN PATENT DOCUMENTS

KR    10-2011-0012796 A    2/2011

* cited by examiner

*Primary Examiner* — Walter H Swanson
(74) *Attorney, Agent, or Firm* — Muir Patent Law, PLLC

(57) ABSTRACT

A hardmask structure including a plurality of hardmask layers is formed on a target layer in a first area and a second area, a first photoresist pattern in the first area and a second photoresist pattern in the second area are formed, a reversible hardmask pattern including a plurality of openings is formed by transferring shapes of the first and second photoresist patterns to a reversible hardmask layer that is one of the plurality of hardmask layers, a gap-fill hardmask pattern is formed by filling some of the plurality of openings formed in the first area with a gap-fill hardmask pattern material, and a feature pattern is formed in the target layer by transferring a shape of the gap-fill hardmask pattern to the target layer in the first area and a shape of the reversible hardmask pattern to the target layer in the second area.

20 Claims, 44 Drawing Sheets

METHOD OF FORMING PATTERNS, INTEGRATED CIRCUIT DEVICE, AND METHOD OF MANUFACTURING THE INTEGRATED CIRCUIT DEVICE

CROSS-REFERENCE TO RELATED APPLICATION

This application claims the benefit of priority under 35 U.S.C. § 119 to Korean Patent Application No. 10-2019-0076683, filed on Jun. 26, 2019, in the Korean Intellectual Property Office, the disclosure of which is incorporated herein in its entirety by reference.

BACKGROUND

The inventive concept relates to a method of forming patterns, an integrated circuit device, and a method of manufacturing the integrated circuit device, and more particularly, to a method of forming patterns in a plurality of areas having different pattern densities from each other, a method of manufacturing an integrated circuit device, and the integrated circuit device.

Recently, as down-scaling of integrated circuit devices has rapidly progressed, feature sizes of integrated circuit devices have been miniaturized and line widths of patterns constituting the integrated circuit devices have been gradually reduced. Accordingly, process difficulty has been increased when simultaneously forming patterns having various shapes, various sizes, and various densities required for the integrated circuit devices.

SUMMARY

The inventive concept provides a method of forming patterns suppressing process difficulties and increasing a process margin when forming patterns having various shapes, various sizes, and various densities in a plurality of areas at the same time, and a method of manufacturing an integrated circuit device and/or a semiconductor device by using the method of forming patterns.

The inventive concept provides the integrated circuit device manufactured by these methods.

In a method of forming a pattern according to an aspect of the inventive concept, a target layer is formed on a substrate including a first area and a second area. In the first area and the second area, a hardmask structure including a plurality of hardmask layers on the target layer is formed. In the first area and the second area, a photoresist layer is formed on the hardmask structure. By exposing and developing the photoresist layer, a photoresist pattern including a first photoresist pattern in the first area and a second photoresist pattern in the second area is formed. In the first area and the second area, by transferring a shape of the photoresist pattern onto a reversible hardmask layer among the plurality of hardmask layers, a reversible hardmask pattern including a plurality of openings is formed. In the first area, a gap-fill hardmask pattern is formed by filling some of the plurality of openings formed in the first area with a gap-fill hardmask pattern material. By transferring a shape of the gap-fill hardmask pattern to the target layer in the first area, and by transferring a shape of the reversible hardmask pattern to the target layer in the second area, a feature pattern including a first pattern in the first area and a second pattern in the second area is formed.

In a method of forming a pattern according to another aspect of the inventive concept, a target layer is formed on a substrate including a first area and a second area. On the target layer, a hardmask structure including a plurality of hardmask layers is formed. A photoresist layer is formed on the hardmask structure. By using a one-time exposure process with the photoresist layer, a first photoresist pattern is formed on the hardmask structure in the first area, and a second photoresist pattern is formed on the hardmask structure in the second area. A first pattern and a second pattern are formed from the target layer. The first pattern may be formed in the first area and may have an inverse planar pattern with respect to the first photoresist pattern. The second pattern may be formed in the second area and may have an identical pattern with the second photoresist pattern.

In a method of manufacturing an integrated circuit device according to another aspect of the inventive concept, a target layer is formed on a substrate including a cell array area and a peripheral circuit area. In the cell array area and the peripheral circuit area, a hardmask structure including a plurality of hardmask layers is formed on the target layer. In the cell array area and the peripheral circuit area, a photoresist layer is formed on the hardmask structure. By exposing and developing the photoresist layer, a photoresist pattern including a first photoresist pattern in the cell array area and a second photoresist pattern in the peripheral circuit area is formed. The first photoresist pattern includes a plurality of holes apart from each other, and the second photoresist pattern includes a plurality of line patterns. In the cell array area and the peripheral circuit area, by transferring a shape of the photoresist pattern onto a reversible hardmask layer that is one of the plurality of hardmask layers, a reversible hardmask pattern including a plurality of openings is formed. A gap-fill hardmask pattern is formed in the plurality of openings by filling the plurality of openings with a gap-fill hardmask pattern material. In the cell array area, by transferring a shape of the gap-fill hardmask pattern to the target layer, a plurality of island patterns are formed from the target layer, and in the peripheral circuit area, by transferring a shape of the reversible hardmask pattern to the target layer, a plurality of line patterns are formed from the target layer.

According to another aspect of the inventive concept, there is provided an integrated circuit device formed by the method of forming a pattern according to the inventive concept. The integrated circuit device includes a plurality of bit lines formed on the substrate in the cell array area, and a gate structure formed on the substrate in the peripheral circuit area, wherein a target layer includes a conductive layer including a metal, the plurality of island patterns include a plurality of conductive landing pads that include a top surface of a higher level than the plurality of bit lines in the cell array area and are electrically connected to cell active areas of the substrate via conductive plugs disposed between the bit lines, and the plurality of line patterns include a plurality of conductive patterns that include a top surface of a higher level than the gate structure.

According to an aspect of the present disclosure, a method of manufacturing an integrated circuit device comprises forming a target layer on a substrate comprising a first area and a second area, forming a hardmask structure comprising a plurality of hardmask layers on the target layer in the first area and the second area, forming a photoresist layer on the hardmask structure in the first area and the second area, forming a photoresist pattern by exposing and developing the photoresist layer in the first area and the second area, forming a plurality of openings in a first hard mask pattern in the first area and the second area by transferring a shape of the photoresist pattern onto the first hardmask layer, the patterned first hard mask layer comprising a negative hardmask pattern in the first area and a first positive hardmask pattern in the second area, forming a second positive hardmask pattern in the first area by filling openings of the negative hardmask pattern in the first area with a second positive hardmask pattern material and removing the negative hardmask pattern in the first area, and forming a feature pattern with the target layer by transferring the shapes of the first and second positive hardmask patterns to the target layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
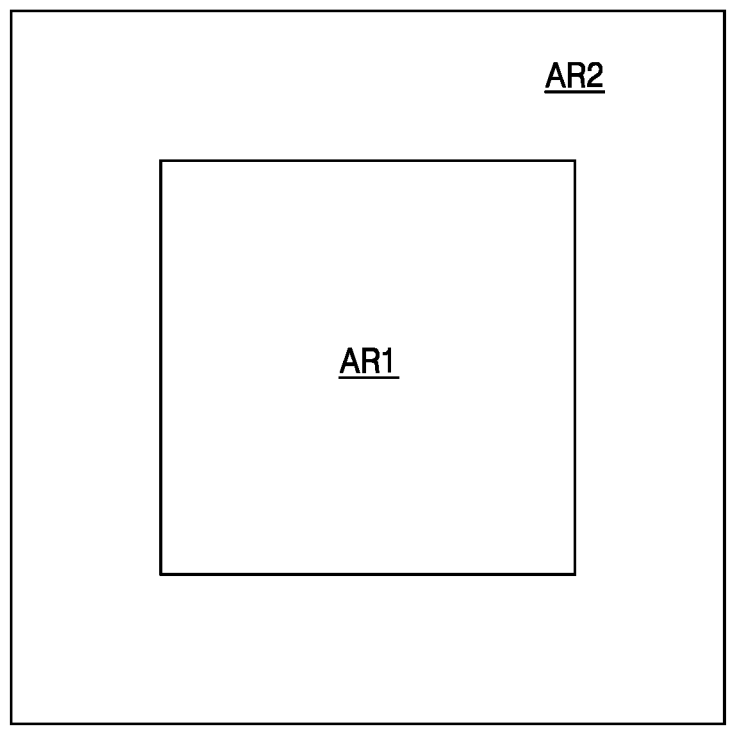
FIG. 1 is a schematic plan view of some configuration of an integrated circuit device, according to a technical idea of the inventive concept.

FIG. 1 is a schematic plan view of some configuration of an integrated circuit device 100, according to a technical idea of the inventive concept.

Referring to FIG. 1, the integrated circuit device 100 may include a first area AR1 and a second area AR2 that have different pattern densities and pattern shapes from each other. The first area AR1 may be a high density area having a relatively high pattern density, and the second area AR2 may be a low density area having a relatively low pattern density. The first area AR1 may be a cell array area of a semiconductor memory device. For example, in the first area AR1, a volatile memory cell array such as dynamic random access memory (DRAM) or a non-volatile memory cell array such as a flash memory may be formed. The second area AR2 may be an edge area of the memory cell array, an area in which peripheral circuits electrically connected to the memory cell arrays formed in the first area AR1 are formed, or the second area AR2 may be a core area. The term "peripheral circuit area" in the present specification may include a core area an area in which the peripheral circuits described above are formed.

In the first area AR1, a plurality of patterns having relatively small widths may be apart from each other in a regular array and may be repeatedly formed at a relatively small pitch. In the second area AR2, a plurality of patterns having non-uniform/different/various widths and lengths may be arranged to be apart from each other with spaces of non-uniform/different/various sizes/distances/widths therebetween and may be repeatedly formed at non-uniform/different/various pitches. A pattern density in the first area AR1 may be greater than that in the second area AR2.

Figure 2A:
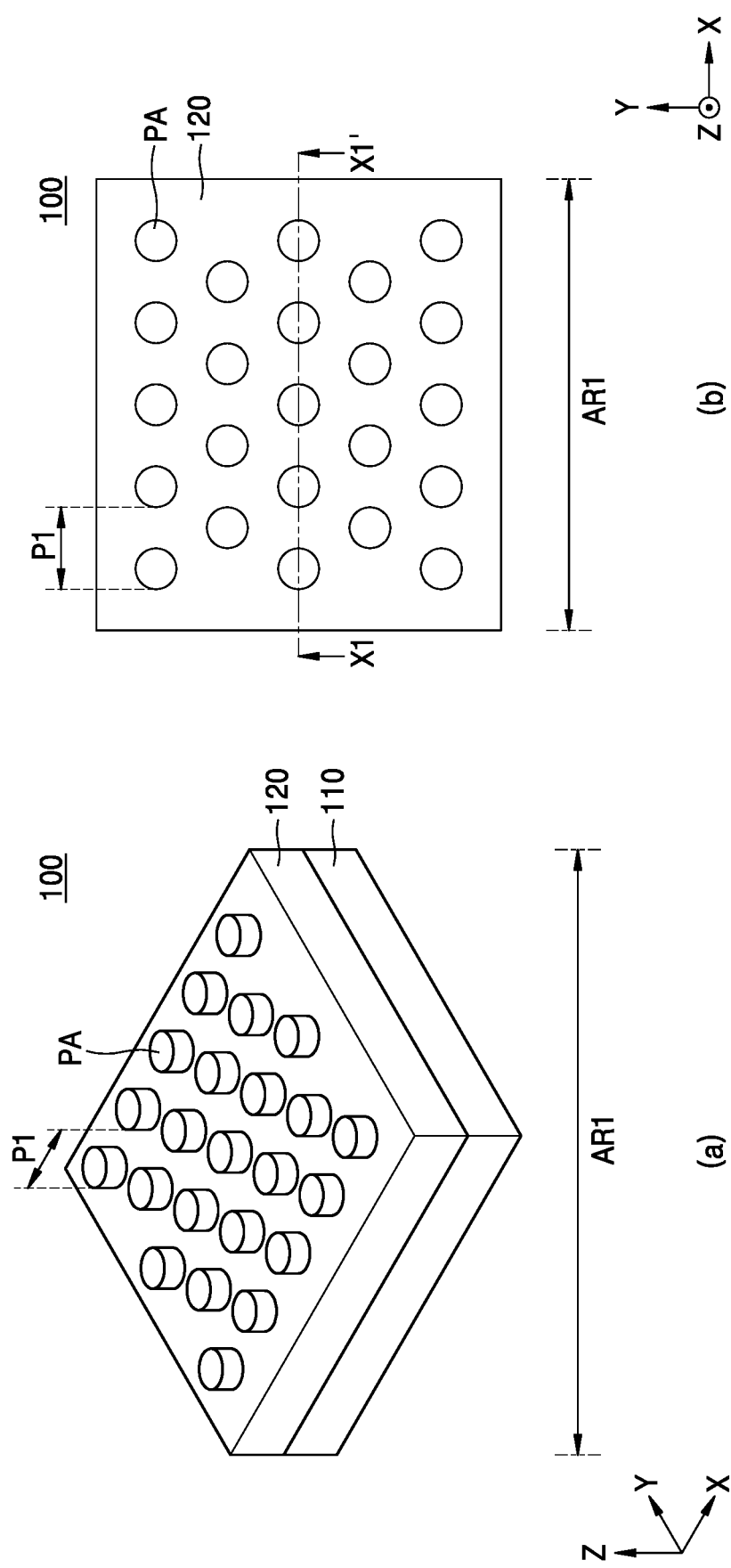
FIG. 2A illustrates a perspective view (a) and a plan view (b) of a plurality of island patterns that may be implemented in a first area of an integrated circuit device, according to embodiments of the inventive concept, respectively.
Figure 2B:
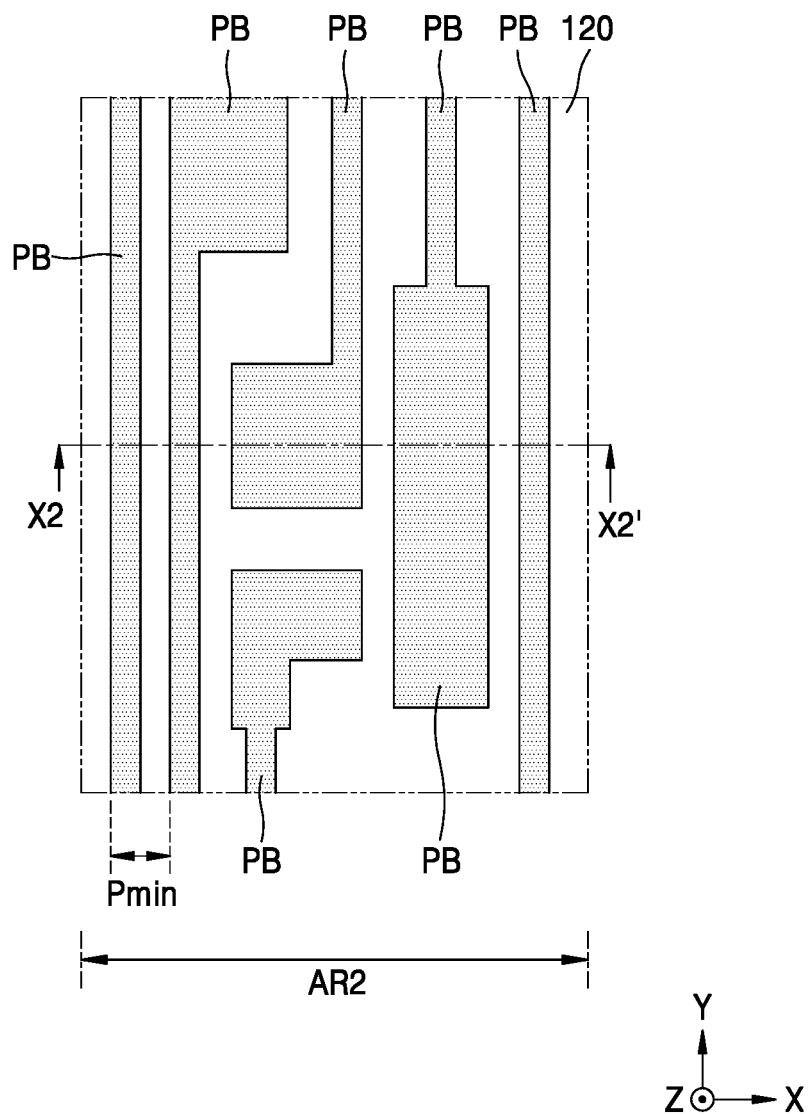
FIG. 2B is a planar layout illustrating a plurality of line patterns that may be implemented in a second area of an integrated circuit device, according to an embodiment of the inventive concept.

FIG. 2A illustrates a plurality of island patterns PA implemented in the first area AR1 of the integrated circuit device 100. In FIG. 2A, (a) is a perspective view of a portion of the first area AR1, and (b) is a plan view of a planar arrangement of the plurality of island patterns PA illustrated in (a). FIG. 2B is a planar layout of a plurality of line patterns PB that may be implemented in the second area AR2 of the integrated circuit device 100.

Referring to FIGS. 2A and 2B, the integrated circuit device 100 may include a substrate 110 and a bottom structure 120 formed on the substrate 110.

The substrate 110 may include a semiconductor element such as Si and Ge, or a compound semiconductor such as SiC, GaAs, InAs, and InP. The bottom structure 120 may include an insulating layer, a conductive layer, or a combination thereof. For example, the bottom structure 120 may include structures including at least one conductive area. The conductive area may include a doped structure, a doped semiconductor layer, a metal layer, or a combination thereof. The bottom structure 120 may include conductive areas, for example, a wiring layer, a contact plug, a transistor, etc., and insulating layers that insulate the conductive areas from each other.

As illustrated in FIG. 2A, the integrated circuit device 100 may include the plurality of island patterns PA that are repeatedly arranged in a horizontal direction, for example, in an X-direction at a first pitch P1 on the bottom structure 120 in the first area AR1. Each of the plurality of island patterns PA may have a cylindrical shape as shown in FIG. 2A(a). The first pitch P1 may be about 30 nm to about 46 nm, for example, about 40 nm to about 45 nm.

The plurality of island patterns PA may include an insulation pattern, a conductive pattern, or a combination thereof. In certain example embodiments, the plurality of island patterns PA may include a doped semiconductor, a metal, a conductive metal nitride, or a combination thereof. The plurality of island patterns PA may have a single layer structure or a multi-layer structure. For example, each layer of the multi-layer structure of the island patterns PA may have identical edge lines in a plan view, e.g., identical planar patterns.

In FIG. 2A, the plurality of island patterns PA are illustrated as being apart from each other and in a regular arrangement of a honeycomb structure in a plan view. However, the technical idea of the inventive concept is not limited thereto. For example, the plurality of island patterns PA may be arranged in a matrix structure in a plan view. For example, the plurality of island patterns PA may be so arranged that each center point of the island patterns PA may be positioned in a vertex of an equilateral triangle or a square formed by connecting center points of adjacent island patterns PA. For example, the island patterns PA may be arranged in a regular order.

As illustrated in FIG. 2B, the integrated circuit device 100 may include the plurality of line patterns PB that are apart from each other on the bottom structure 120 in the second area AR2 and extend in the horizontal direction. At least some of the plurality of line patterns PB may extend in parallel with each other. At least some of the plurality of line patterns PB may be connected to other conductive areas via contacts. For example, some of the plurality of line patterns PB may be electrically connected to another conductor/semiconductor pattern formed in a different height in a vertical direction (Z-direction).

The plurality of line patterns PB may be apart from each other with spaces of various sizes/distances between the line patterns PB (e.g., wires) in the horizontal direction, for example, in the X-direction or a Y-direction. A minimum separation distance between two line patterns PB adjacent to each other in some areas of the second area AR2 may be a minimum feature size of the integrated circuit device 100. The minimum separation distance between two line patterns PB adjacent to each other in other areas of the second area AR2 may be several to several tens of times the minimum feature size of the integrated circuit device 100. A minimum pitch Pmin of the plurality of line patterns PB may be about 30 nm to about 46 nm, for example, about 40 nm to about 45 nm. For example, the minimum feature size of the integrated circuit device 100 may be the least width of patterns or the least distance between patterns formed in the integrated circuit device 100 or a similar size. For example, the minimum feature size of the integrated circuit device 100 may be 20 nm or less. In certain embodiments, the minimum feature size of the integrated circuit device 100 may be 15 nm or less. For example, the minimum pitch Pmin of the plurality of line patterns PB may be the least pitch of the line patterns PB formed in the same layer.

A horizontal direction width of each of the plurality of line patterns PB, for example, an X-direction width and a Y-direction width, and a horizontal direction separation distance between the line patterns PB, for example, an X-direction separation distance and a Y-direction separation may vary. A horizontal minimum separation distance between two adjacent line patterns PB may be at least the minimum feature size of the integrated circuit device 100. For example, the second area AR2 may include an area having the minimum horizontal separation distance of about 20 nm or less between two adjacent line patterns PB and may also include an area having the minimum horizontal separation distance of about 20 nm or more, for example, about 40 nm or more. In addition, the plurality of line patterns PB may include a portion having a width direction size, that is, an X-direction size of about 20 nm or more, for example, about 40 nm or more.

The plurality of line patterns PB may include an insulation pattern, a conductive pattern, or a combination thereof. In certain example embodiments, the plurality of line patterns PB may include a doped semiconductor, a metal, a conductive metal nitride, or a combination thereof. The plurality of line patterns PB may have a single layer structure or a multi-layer structure. For example, each layer of the multi-layer structure of the line patterns PB may have identical edge lines in a plan view. In the first area AR1 and the second area AR2, the plurality of island patterns PA and the plurality of line patterns PB may include the same material.

FIGS. 3A through 3M are cross-sectional views illustrating a method of forming patterns, according to embodiments of the inventive concept. A method of forming the plurality of island patterns PA and the plurality of line patterns PB included in the integrated circuit device 100 illustrated in FIGS. 2A and 2B is described with reference to FIGS. 3A through 3M. In FIGS. 3A through 3M, cross-sectional configurations according to a process order of areas corresponding to a cross-section of X1-X1' line in Section (b) in FIG. 2A and a cross-section of X2-X2' line in FIG. 2B are illustrated, respectively.

Figure 3A:
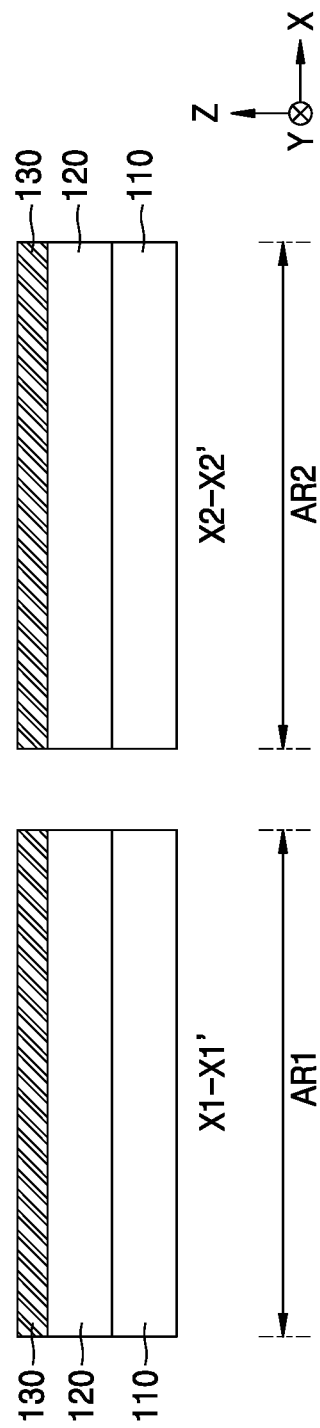
FIGS. 3A through 3M are cross-sectional views illustrating a method of forming patterns according to a process order, according to embodiments of the inventive concept.

Referring to FIG. 3A, the bottom structure 120 may be formed on the substrate 110. In the first area AR1 and the second area AR2, levels of a top surface of the bottom structure 120 may be substantially the same as or similar to each other. In this case, the term "level" may denote a vertical height from a top surface of the substrate 110. For example, the thicknesses of the bottom structure 120 in the first and second areas AR1 and AR2 may be the same. A to-be-etched layer 130 may be formed on the bottom structure 120. The to-be-etched layer 130 may include the same material as a material of the plurality of island patterns PA and the plurality of line patterns PB. For example, the to-be-etched layer 130 may be a target layer with which a target pattern that is remained in a final product is formed.

Figure 3B:
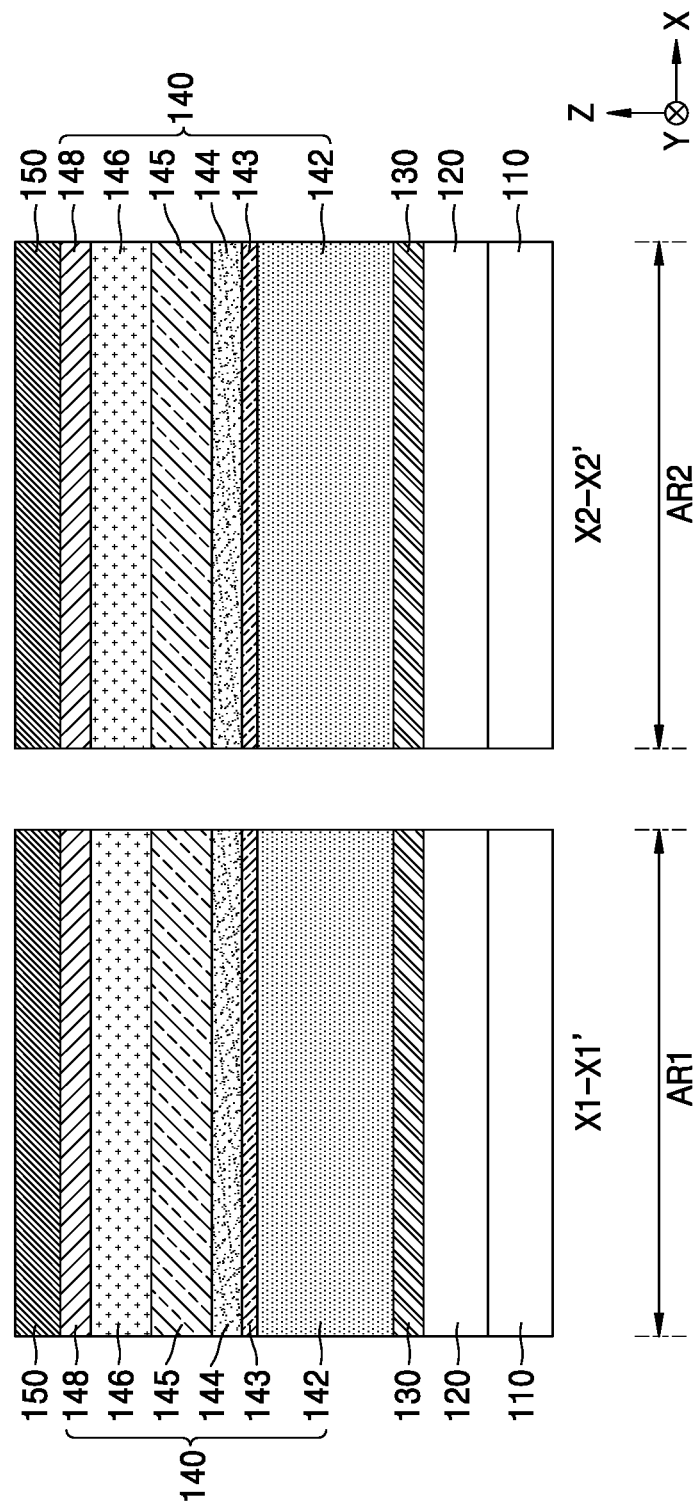

Referring to FIG. 3B, a hardmask structure 140 including a plurality of hardmask layers may be formed on the to-be-etched layer 130, and a photoresist layer 150 may be formed on the hardmask structure 140.

The hardmask structure 140 may include a first bottom hardmask layer 142, a second bottom hardmask layer 143, a main hardmask layer 144, and a reversible hardmask layer 145, a top hardmask layer 146, and an anti-reflection layer 148, which are sequentially stacked on the to-be-etched layer 130. Each of the first bottom hardmask layer 142, the second bottom hardmask layer 143, the main hardmask layer 144, the reversible hardmask layer 145, the top hardmask layer 146, and the anti-reflection layer 148 may include a different material which has different etching selectivity from other materials of neighboring layers at its bottom and top. For example, each of the layers 142-146 and 148 may have a high etching selectivity with respect to its directly adjacent/contacting layers. For example, the etch rate of each of the layers 142-146 and 148 may be 3 times or more of its immediately adjacent under layer. For example, immediately adjacent layers of the stacked layers may include different materials from each other.

In example embodiments, the first bottom hardmask layer 142 may include an amorphous carbon layer (ACL), a silicon oxide layer, or a silicon nitride layer. The first bottom hardmask layer 142 may have a thickness of about 1000 Å to about 2000 Å. When the first bottom hardmask layer 142 includes an ACL, the second bottom hardmask layer 143 may include a silicon oxide layer. The second bottom hardmask layer 143 may have a thickness of about 100 Å to about 400 Å. When the second bottom hardmask layer 143 includes a silicon oxide layer, the main hardmask layer 144 may include polysilicon. The main hardmask layer 144 may have a thickness of about 100 Å to about 400 Å. When the main hardmask layer 144 includes polysilicon, the reversible hardmask layer 145 may include a silicon oxide layer. The reversible hardmask layer 145 may have a greater thickness than the main hardmask layer 144. For example, the reversible hardmask layer 145 may have a thickness of about 300 Å to about 1000 Å. The top hardmask layer 146 may include a spin on hardmask (SOH) layer which is a layer including a hydrocarbon compound or a derivative thereof having a relatively high carbon content of about 85 wt % to about 99 wt %. For example, an SOH layer may be formed by a spin coating process. The top hardmask layer 146 may have a thickness of about 300 Å to about 1000 Å. The anti-reflection layer 148 may include silicon nitride, silicon oxynitride, amorphous silicon, titanium, titanium dioxide, titanium nitride, chromium oxide, carbon, an organic anti-reflective coating (ARC) material, or a combination thereof. The anti-reflection layer 148 may have a thickness of about 200 Å to about 400 Å.

The photoresist layer 150 may include a photoresist for extreme ultraviolet (EUV) (having a wavelength about 13.5 nm), a photoresist for KrF excimer laser (e.g., having a wavelength about 248 nm), a photoresist for ArF excimer laser (having a wavelength about 193 nm), or a photoresist for $F_2$ excimer laser (having a wavelength about 157 nm).

Figure 3C:
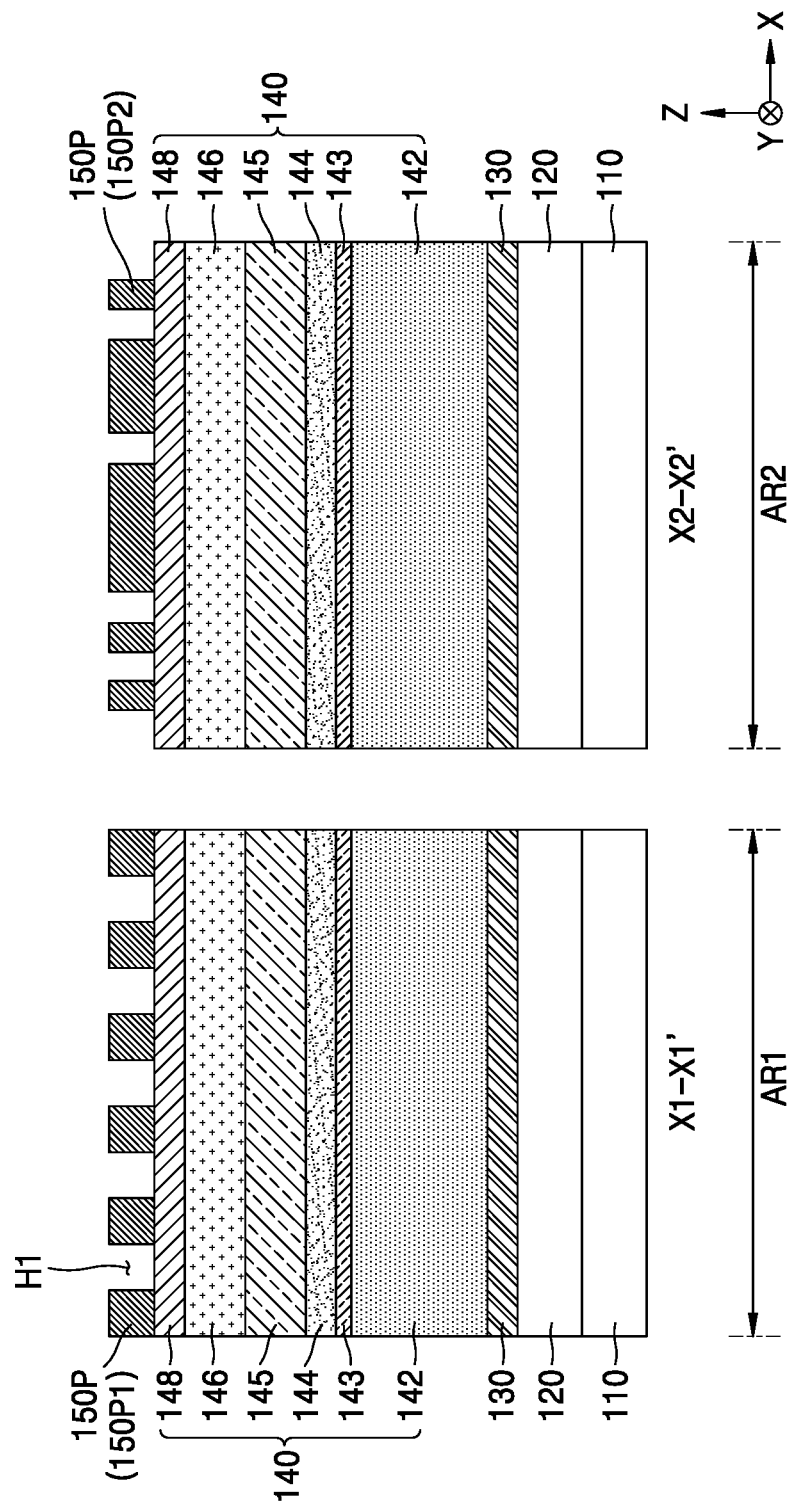

Referring to FIG. 3C, the photoresist layer 150 may be exposed to a light pattern and developed simultaneously in the first area AR1 and the second area AR2, and a photoresist pattern 150P may be formed from the photoresist layer 150.

The photoresist pattern 150P may include a first photoresist pattern 150P1 arranged in the first area AR1 and a second photoresist pattern 150P2 arranged in the second area AR2. The first photoresist pattern 150P1 may have an intaglio pattern having a planar shape inverse to the planar shape of the plurality of island patterns PA (refer to FIG. 2A) to be formed in the first area AR1. For example, the first photoresist pattern 150P1 may have an inverse pattern of the island patterns PA shown in FIG. 2A, e.g., in plan views. A planar shape of a plurality of holes H1 formed in the first photoresist pattern 150P1 may be the same as the planar shape of the plurality of island patterns PA illustrated in FIG. 2A. For example, the plurality of holes H1 formed in the first photoresist pattern 150P1 may correspond to the plurality of island patterns PA shown in FIG. 2A.

The second photoresist pattern 150P2 may have an embossed pattern having the same planar shape as that of the plurality of line patterns PB (see FIG. 2B) to be formed in the second area AR2. The planar shape of the second photoresist pattern 150P2 may be the same as the planar shape of the plurality of line patterns PB illustrated in FIG. 2B. For example, plan views of the second photoresist pattern 150P2 and the line patterns PB shown in FIG. 2B may be identical.

When the photoresist layer 150 is exposed to a light pattern simultaneously in the first area AR1 and the second area AR2, the EUV light (e.g., having a wavelength about 13.5 nm), the KrF excimer laser (having a wavelength about 248 nm), the ArF excimer laser (having a wavelength about 193 nm), or the $F_2$ excimer laser (having a wavelength about 157 nm) may be used as a light source.

Figure 3D:
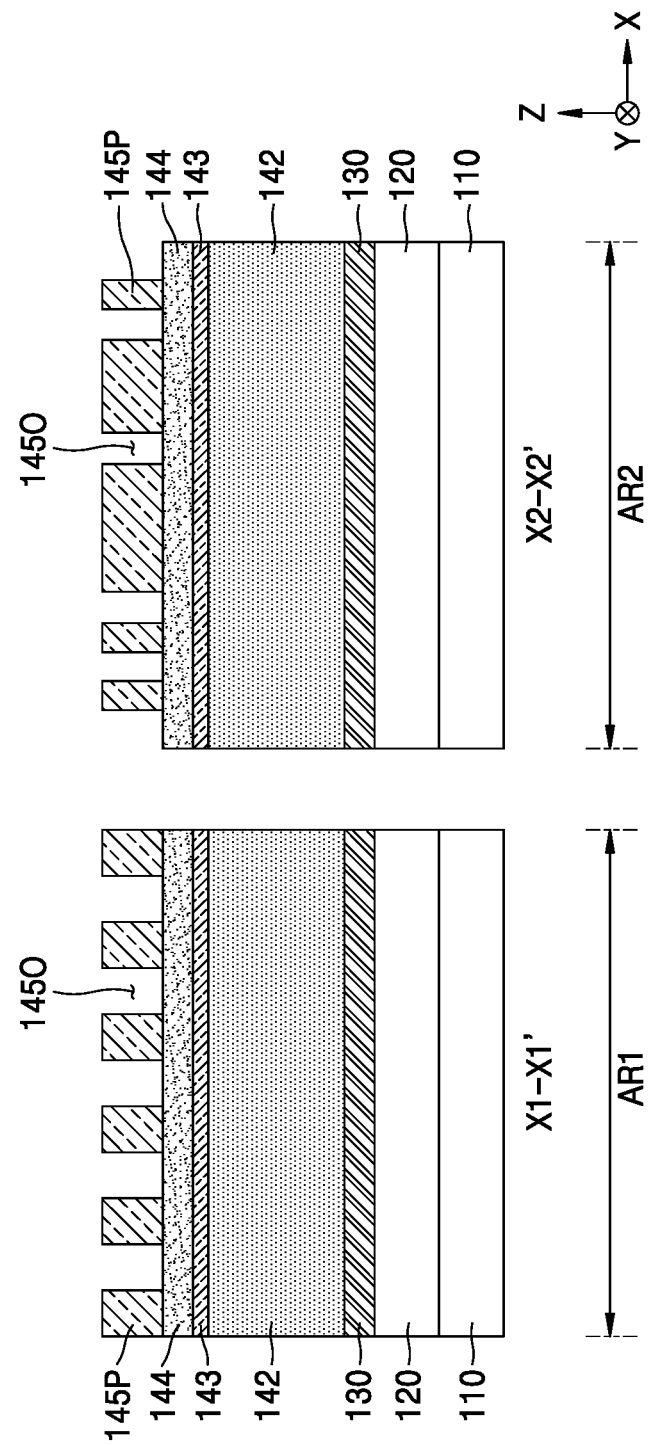

Referring to FIG. 3D, a reversible hardmask pattern 145P to which the shape of the photoresist pattern 150P has been transferred may be formed by sequentially etching the anti-reflection layer 148, the top hardmask layer 146, and the reversible hardmask layer 145 by using the photoresist pattern 150P as an etching mask in the first area AR1 and the second area AR2. For example, the photoresist pattern 150 is transferred to form the reversible hardmask pattern 145P, and the reversible hardmask pattern 145P may have an identical plan view to the photoresist pattern 150P.

While the etching process is performed until the reversible hardmask pattern 145P is obtained, at least portions of the photoresist pattern 150P, the anti-reflection layer 148, and the top hardmask layer 146 may be consumed. Unnecessary materials remaining on the reversible hardmask pattern 145P may be removed, and a top surface of the reversible hardmask pattern 145P may be exposed. In the first area AR1 and the second area AR2, the reversible hardmask pattern 145P may include a plurality of openings 145O, and a portion of a top surface of the main hardmask layer 144 may be exposed via the plurality of openings 145O. In the first area AR1, a planar shape of the plurality of openings 145O formed in the reversible hardmask pattern 145P may be the same as the planar shape of the plurality of island patterns PA illustrated in FIG. 2A. For example, the openings 145O formed in the first area AR1 may correspond to the island patterns PA shown in FIG. 2A.

Figure 3E:
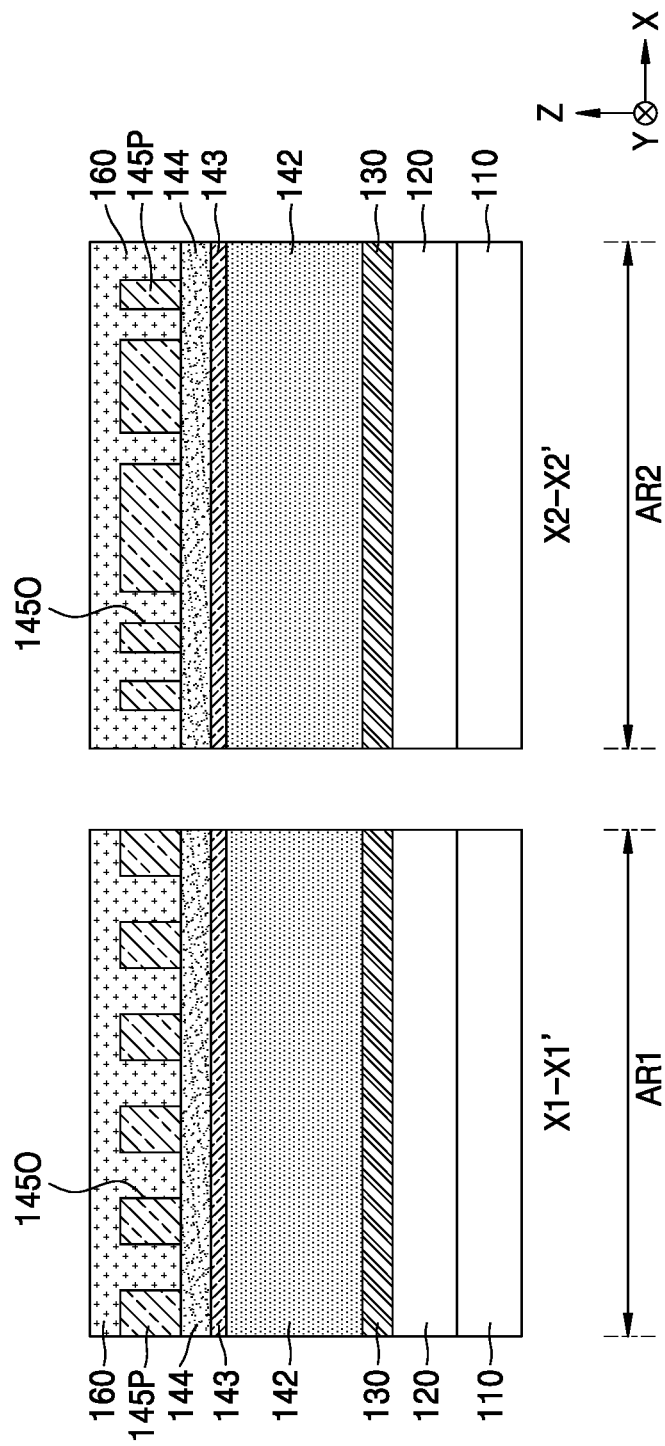

Referring to FIG. 3E, a gap-fill hardmask layer 160 may be formed on a resultant product of FIG. 3D. The gap-fill hardmask layer 160 may fill the plurality of openings 145O of the reversible hardmask pattern 145P in the first area AR1 and the second area AR2 and may be formed to cover the top surface of the reversible hardmask pattern 145P.

The gap-fill hardmask layer 160 may include the SOH layer. To form the gap-fill hardmask layer 160, an SOH material layer including an organic compound having a thickness of about 500 Å to about 2000 Å may be formed on the resultant product of FIG. 3D by using a spin coating process. The SOH material may include a hydrocarbon compound including an aromatic ring such as phenyl, benzene, and naphthalene. The SOH material may include a material having a relatively high carbon content of about 85% to about 99% by weight based on a total weight thereof. The SOH layer may be formed by curing the SOH material layer through a first bake process at a temperature of about 150° C. to about 350° C. for about 60 seconds, and a second bake process at a temperature of about 300° C. to about 550° C. for about 30 seconds to 300 seconds.

Figure 3F:
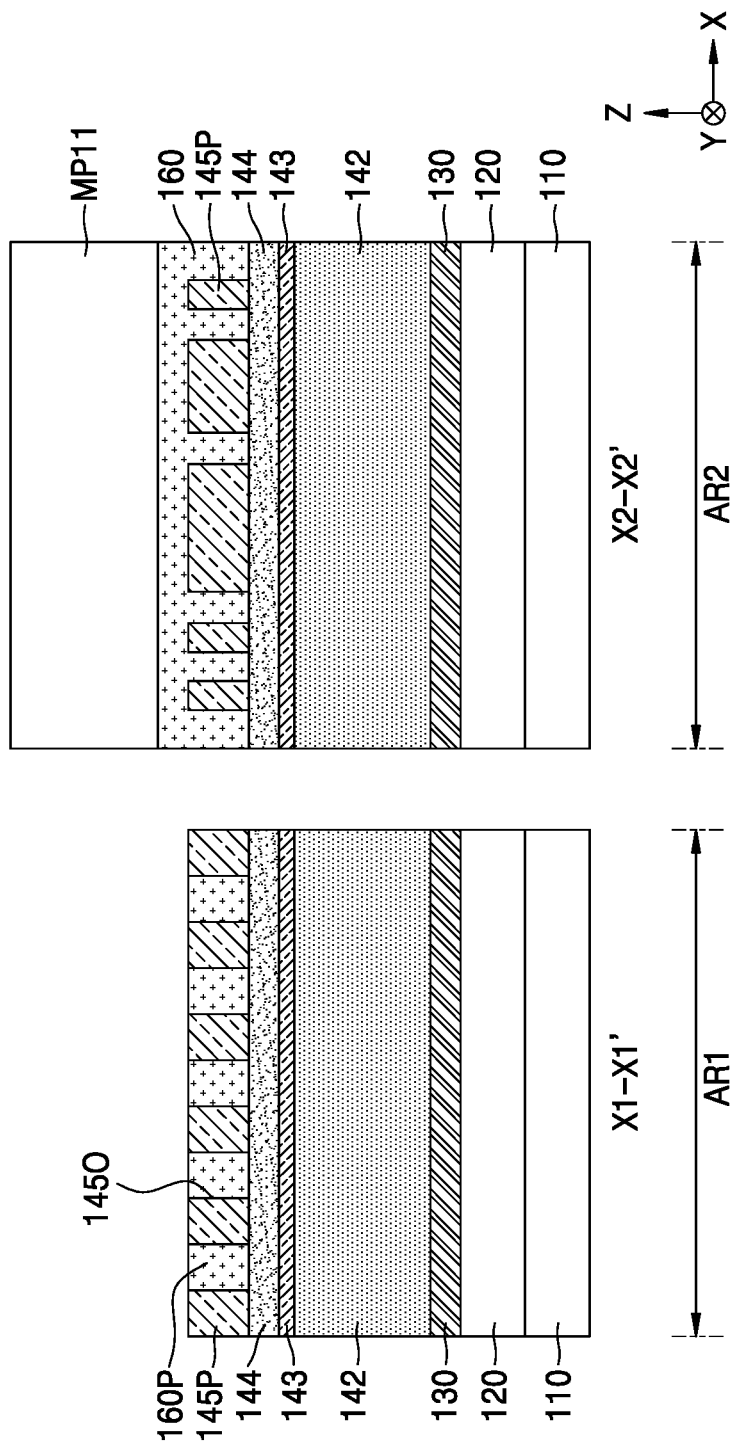

Referring to FIG. 3F, a mask pattern MP11 covering the second area AR2 may be formed on a resultant product of FIG. 3E, and the top surface of the reversible hardmask pattern 145P may be exposed by etch-backing the gap-fill hardmask layer 160 exposed in the first area AR1. As a result, in the first area AR1, a gap-fill hardmask pattern 160P, which includes portions remaining in the openings 145O of the reversible hardmask pattern 145P in the gap-fill hardmask layer 160, may be formed. A planar shape of the gap-fill hardmask pattern 160P may be the same as the planar shape of the plurality of island patterns PA illustrated in FIG. 2A. For example, a plan view of the gap-fill hardmask pattern 160P formed in the first area AR1 may be identical to the plan view of the island patterns PA in the first area AR1 shown in FIG. 2A. The mask pattern MP11 may be/have a photoresist pattern. In example embodiments, the mask pattern MP11 may include a photoresist for the KrF excimer laser (about 248 nm).

Figure 3G:
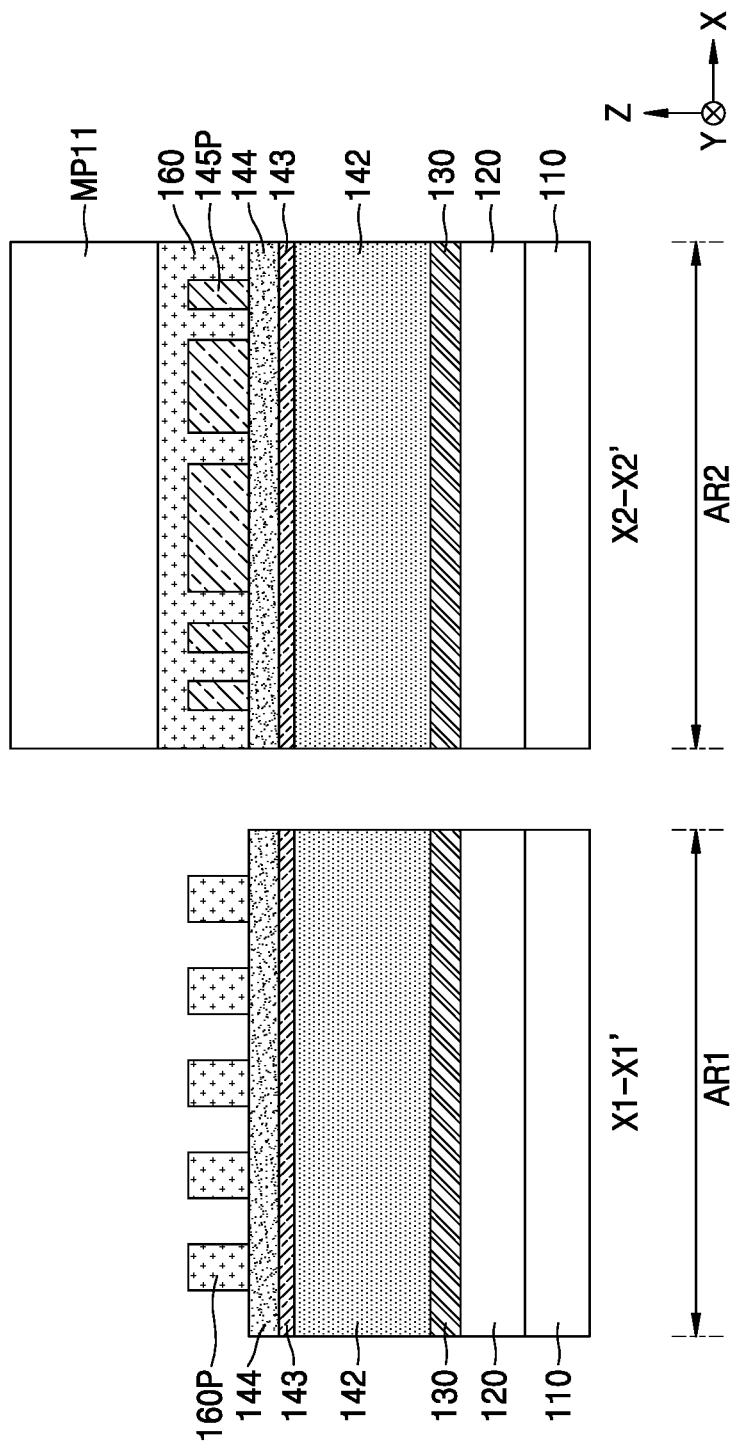

Referring to FIG. 3G, the reversible hardmask pattern 145P in the first area AR1 may be etched and removed from a resultant product of FIG. 3F by using the mask pattern MP11 and the gap-fill hardmask pattern 160P as etching masks, and the top surface of the main hardmask layer 144 may be exposed through/between gap-fill hardmask patterns 160P. For example, the reversible hardmask pattern 145P may be a hardmask pattern used to form another hardmask pattern (e.g., the gap-fill hardmask pattern 160P) having an inverse pattern with respect to the reversible hardmask pattern 145P in a plan view.

Figure 3H:
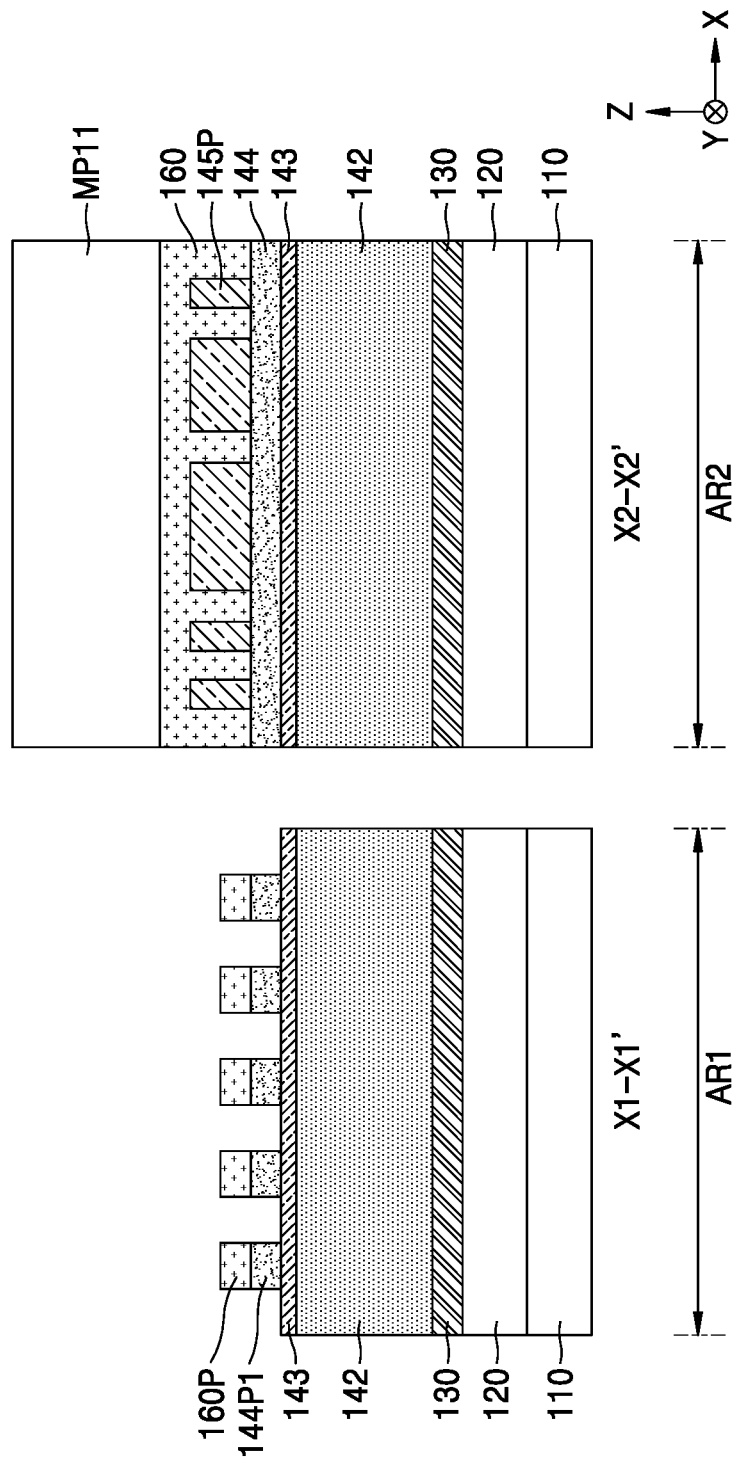

Referring to FIG. 3H, the exposed portion of the main hardmask layer 144 in the first area AR1 may be etched from a resultant product of FIG. 3G by using the mask pattern MP11 and the gap-fill hardmask pattern 160P as etching masks, and a first main hardmask pattern 144P1 may be formed. While the etching process for forming the first main hardmask pattern 144P1 is performed, at least a portion of the gap-fill hardmask pattern 160P exposed to an etching atmosphere in the first area AR1 may be consumed, and a height of the gap-fill hardmask pattern 160P may be decreased. While the etching process for forming the first main hardmask pattern 144P1 is performed, the second bottom hardmask layer 143 may be used as an etch-stop layer and may protect the first bottom hardmask layer 142. In the first area AR1, a top surface of the second bottom hardmask layer 143 may be exposed through/between first main hardmask patterns 144P1.

Figure 3I:
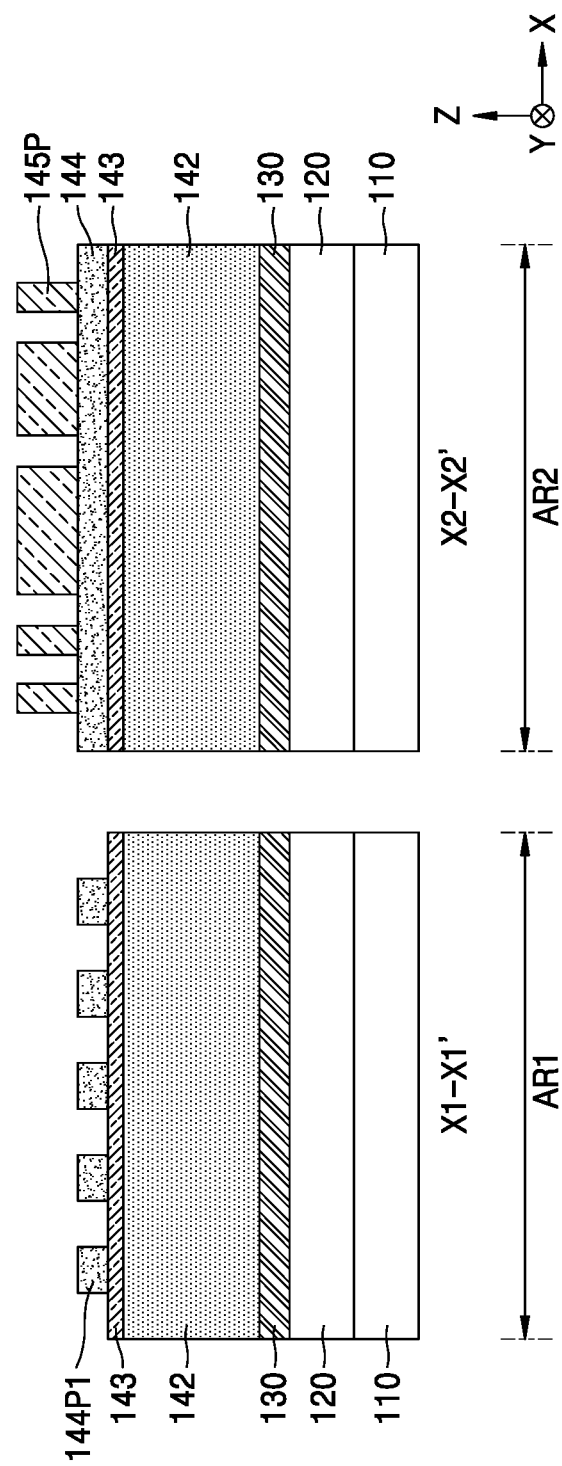

Referring to FIG. 3I, the gap-fill hardmask pattern 160P that remains in the first area AR1, and the mask pattern MP11 and the gap-fill hardmask layer 160 that remain in the second area AR2 may be selectively removed from a resultant product of FIG. 3H. To this end, asking and stripping processes may be used. As a result, the first main hardmask pattern 144P1 may remain on the second bottom hardmask layer 143 in the first area AR1, and the main hardmask layer 144 and the reversible hardmask pattern 145P may remain on the second bottom hardmask layer 143 in the second area AR2. In the second area AR2, a planar shape of the reversible hardmask pattern 145P may be the same as the planar shape of the plurality of line patterns PB illustrated in FIG. 2B. For example, a plan view of the reversible hardmask pattern 145P may be identical to the plan view of the plurality of line patterns PB shown in FIG. 2B.

Figure 3J:
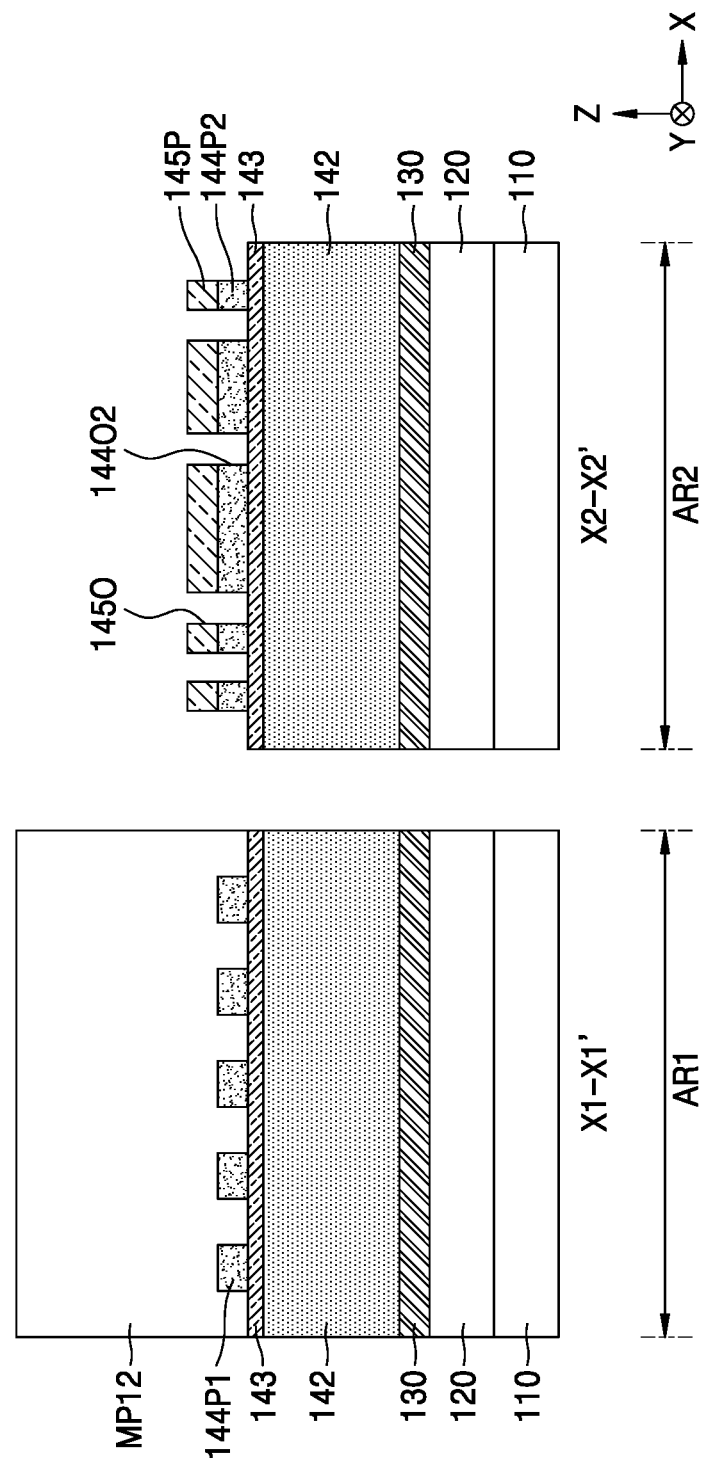

Referring to FIG. 3J, on a resultant product of FIG. 3I, a mask pattern MP12 covering the first area AR1 may be formed, and a second main hardmask pattern 144P2 may be formed by etching the main hardmask layer 144 in the second area AR2 by using the mask pattern MP12 and the reversible hardmask pattern 145P in the second area AR2 as etching masks. While the main hardmask layer 144 is etched, at least a portion of the reversible hardmask pattern 145P exposed to the etching atmosphere in the second area AR2 may be consumed, and thus, a height of the reversible hardmask pattern 145P may be decreased. In this case, the second bottom hardmask layer 143 may be used as an etch-stop layer and may protect the first bottom hardmask layer 142 thereunder. In the second area AR2, a top surface of the second bottom hardmask layer 143 may be partially exposed via the plurality of openings 1450 in the reversible hardmask pattern 145P and a plurality of openings 14402 in the second main hardmask pattern 144P2.

Figure 3K:
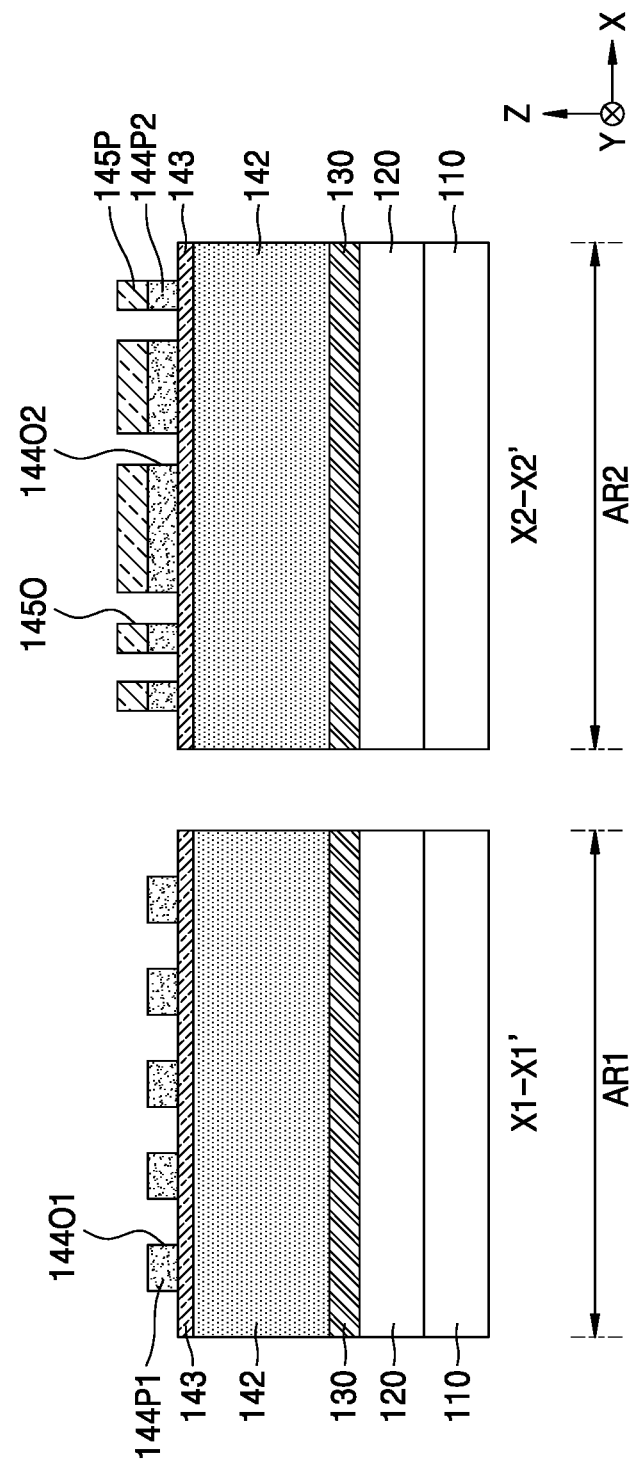

Referring to FIG. 3K, the first main hardmask pattern 144P1 may be exposed in the first area AR1 by removing the mask pattern MP12 from a resultant product of FIG. 3J. A top surface of the second bottom hardmask layer 143 may be partially exposed via a plurality of openings 14401 in the first main hardmask pattern 144P1.

Figure 3L:
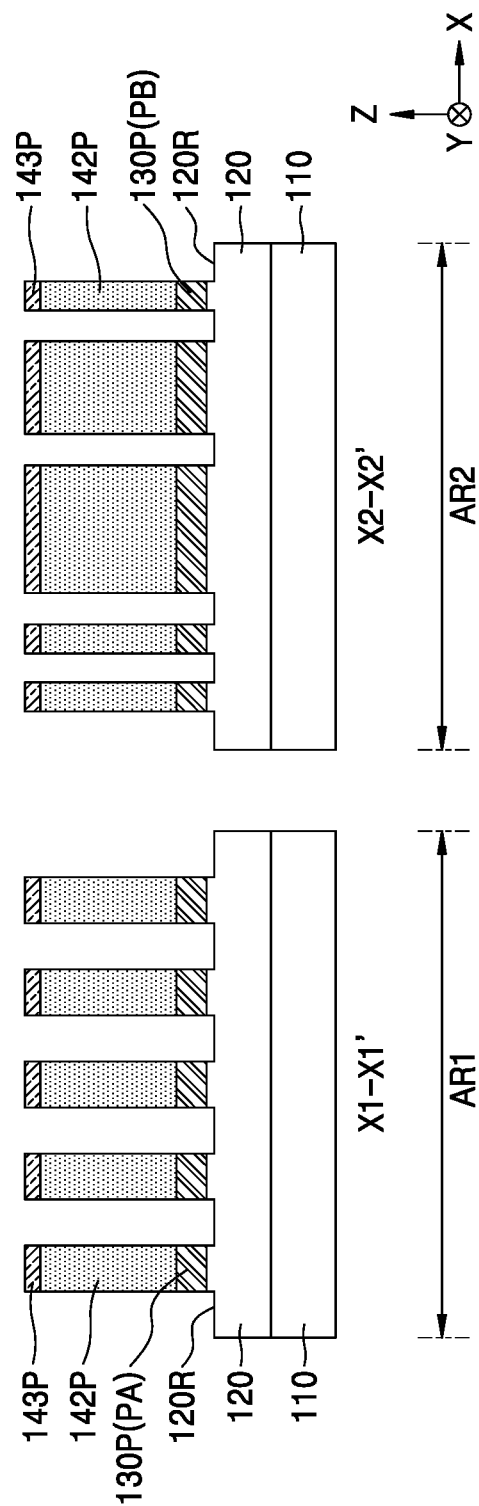

Referring to FIG. 3L, by using the first main hardmask pattern 144P1 in the first area AR1 and the reversible hardmask pattern 145P and the second main hardmask pattern 144P2 in the second area AR2 as etching masks, the second bottom hardmask layer 143 exposed via the plurality of openings (14401 and 14402) and the first bottom hardmask layer 142 thereunder may be sequentially etched from a resultant product of FIG. 3K, the first bottom hardmask pattern 142P and the second bottom hardmask pattern 143P may be formed, and next, the feature pattern 130P may be formed by etching the to-be-etched layer 130. A portion of the feature pattern 130P in the first area AR1 may be a result to which the shape of the gap-fill hardmask pattern 160P (refer to FIG. 3G) has been transferred and may constitute the plurality of island patterns PA illustrated in FIG. 2A. For example, the portion of the feature pattern 130P formed in the first area AR1 may have an identical plan view to the gap-fill hardmask pattern 160P. A portion of the feature pattern 130P in the second area AR2 may be a result to which a portion of the reversible hardmask pattern 145P (refer to FIGS. 3D through 3I) in the second area AR2 has been transferred and may constitute the plurality of line patterns PB illustrated in FIG. 2B. For example, the portion of the feature pattern 130P formed in the second area AR2 may have an identical plan view to the reversible hardmask pattern 145P in the second area AR2.

At least some of patterns on a top portion of the feature pattern 130P may be consumed by the etching process/ atmosphere during the etching process for forming the feature pattern 130P. Although FIG. 3L illustrates a case where the first bottom hardmask pattern 142P and the second bottom hardmask pattern 143P remain on the feature pattern 130P, the second bottom hardmask pattern 143P may be also consumed by the etching process/atmosphere, and only a portion of the first bottom hardmask pattern 142P may remain on the feature pattern 130P.

In example embodiments, after the feature pattern 130P is formed, a portion of the bottom structure 120 may be etched by over-etching, and accordingly, a recess area 120R may be formed on the top surfaces of the bottom structure 120 in the first area AR1 and the second area AR2. In some example embodiments, the recess area 120R may not be formed in at least one of the first area AR1 and the second area AR2.

Figure 3M:
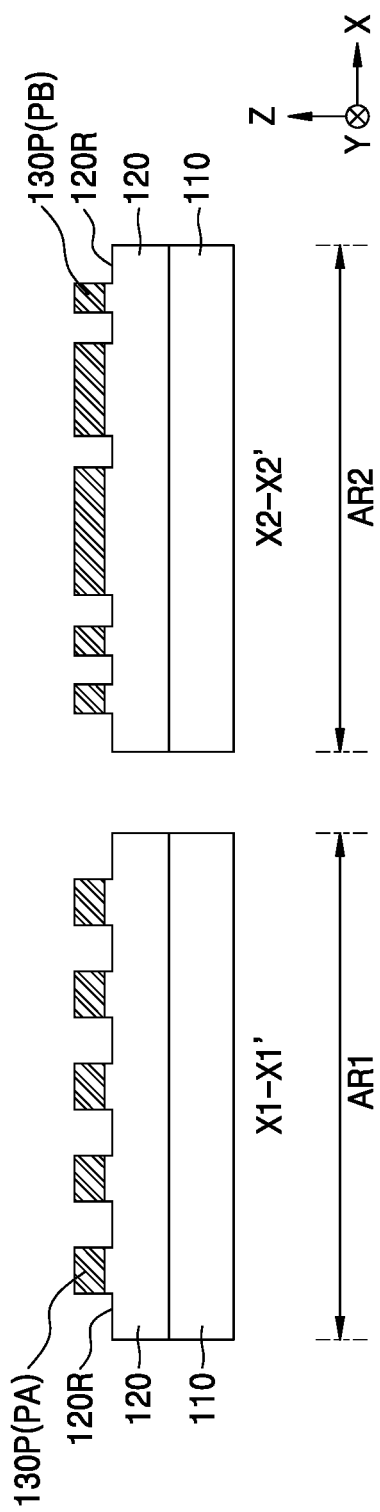

Referring to FIG. 3M, a top surface of the feature pattern 130P may be exposed by removing unnecessary materials (e.g., residual of the first/second bottom hardmask patterns 142P/143P) remaining on the feature pattern 130P. To this end, ashing and stripping processes may be used.

For example, the reversible hardmask pattern 145P may include a negative hardmask pattern in the first area AR1 and a first positive hardmask pattern in the second area AR2. The negative hardmask pattern in the first area AR1 may be used to form a second positive hardmask pattern (the gap-fill hardmask pattern 160P) in the first area AR1 by filling openings of the negative hardmask pattern with the gap-fill hardmask layer 160 and by performing subsequent steps forming the gap-fill hardmask pattern 160P in the first area. For example, the negative hardmask pattern may have an inverse plan view pattern of a target pattern (e.g., the feature pattern 130P) finally formed on the substrate 110 using the hardmask including the negative hardmask pattern by transferring the shape of the negative hardmask pattern to a target layer (e.g., to-be-etched layer 130) and the positive hardmask pattern may have an identical plan view pattern to a target pattern (e.g., the feature pattern 130P) finally formed on the substrate 110 using the hardmask including the positive hardmask pattern by transferring the shape of the positive hardmask pattern to the target layer (e.g., to-be-etched layer 130). In certain embodiments, transferring a shape of holes or empty portion of a mask pattern to a lower layer may form a real pattern in the lower layer having the same shape as the cases in the negative hardmask pattern. For example, a negative shape of a mask pattern may be transferred to a lower layer as a positive pattern. Similarly, a positive shape of a mask pattern may be transferred to a lower layer as a negative shape.

Figure 4A:
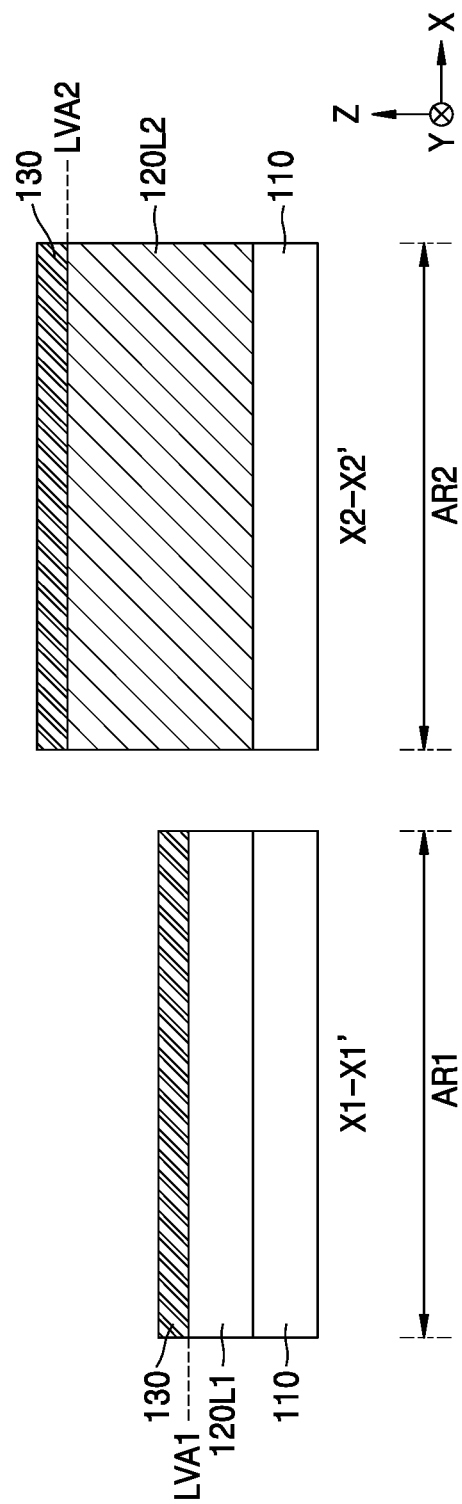
FIGS. 4A through 4C are cross-sectional views illustrating a method of forming patterns according to a process order, according to some embodiments of the inventive concept.
Figure 4B:
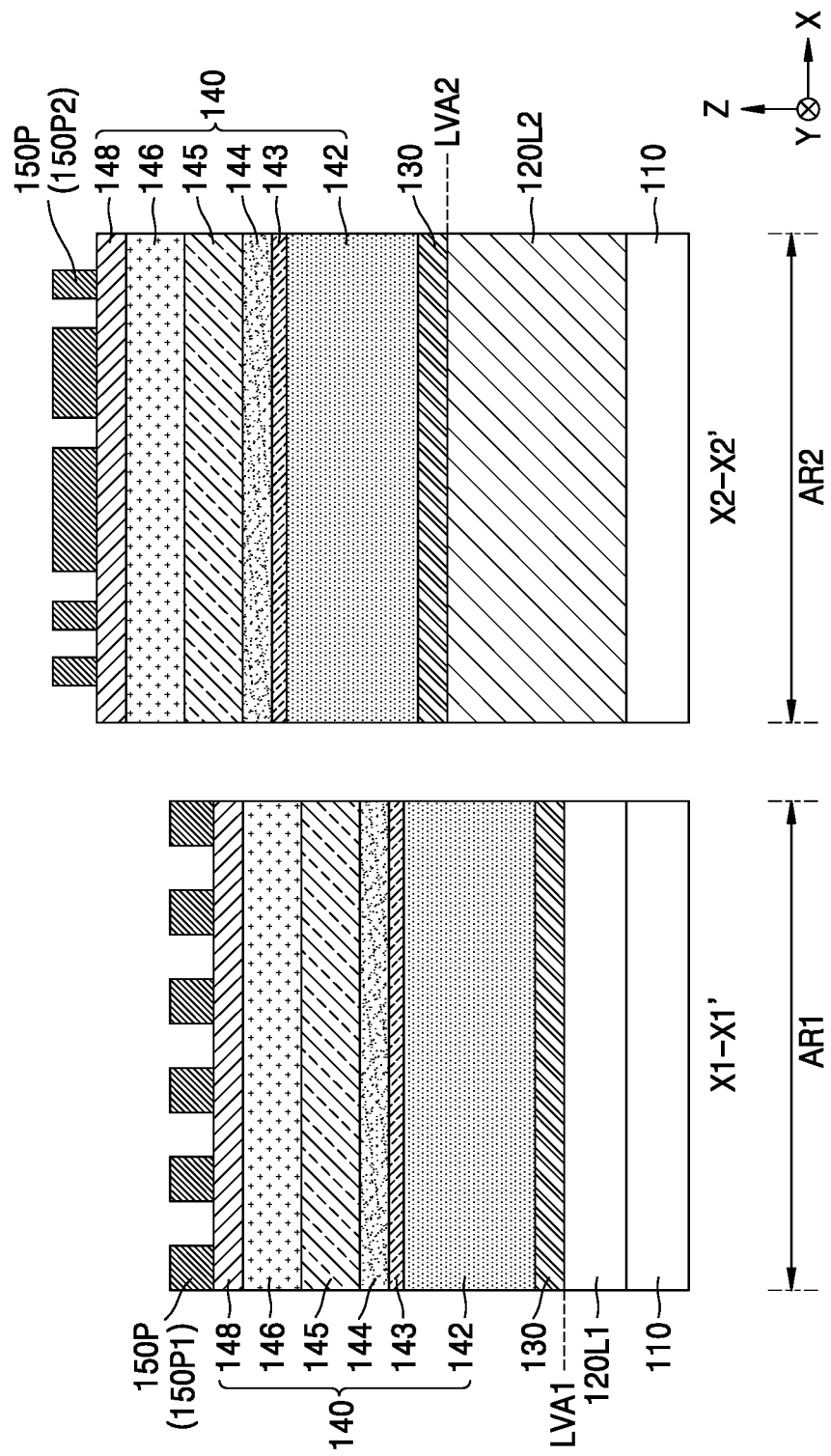
Figure 4C:
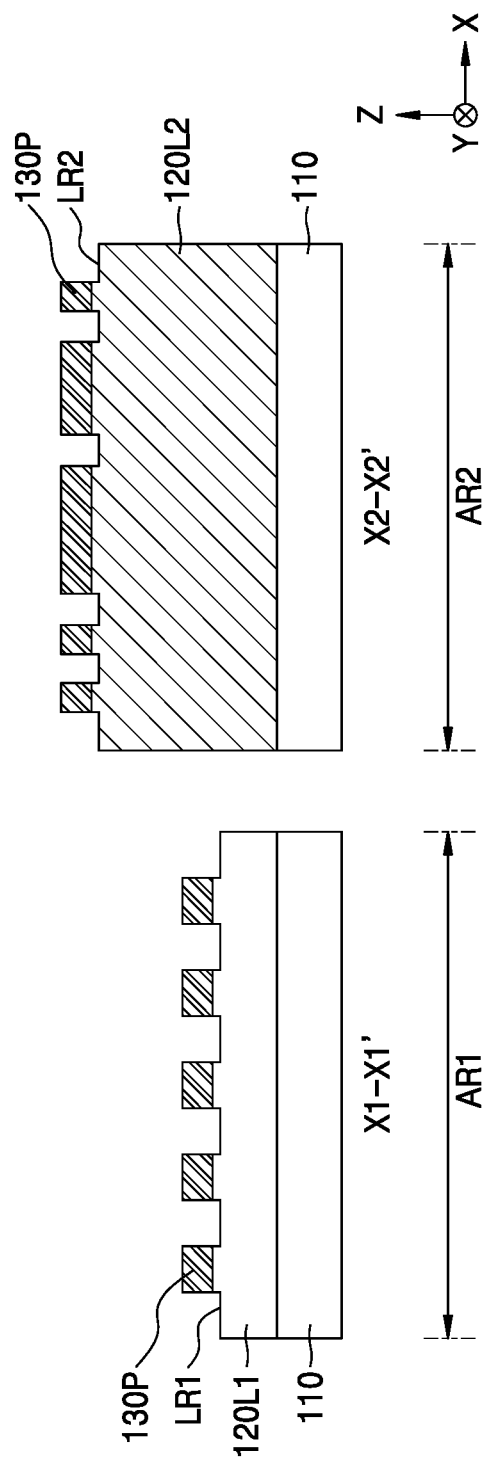

FIGS. 4A through 4C are cross-sectional views illustrating a method of forming patterns according to a process order, according to some embodiments of the inventive concept. Another method of forming the plurality of island patterns PA and the plurality of line patterns PB illustrated in FIGS. 2A and 2B is described with reference to FIGS. 4A through 4C. However, in this example, a case where levels of patterns to be formed in the first area AR1 are lower than levels of patterns to be formed in the second area AR2 is described. In FIGS. 4A through 4C, the same reference numerals as those in FIGS. 3A through 3M may denote the same members, and descriptions thereof are omitted here.

Referring to FIG. 4A, a first bottom structure 120L1 including a top surface of a first level LVA1 may be formed on the substrate 110 in the first area AR1, and a second bottom structure 120L2 including a top surface of a second level LVA2 may be formed on the substrate 110 in the second area AR2. The first level LVA1 may be lower than the second level LVA2. For example, thicknesses of the first bottom structure 120L1 and the second bottom structure 120L2 may be different from each other, and the first bottom structure 120L1 may be thinner than the second bottom structure 120L2. The to-be-etched layer 130 may be formed on the first bottom structure 120L1 and the second bottom structure 120L2. More detailed configurations of the first bottom structure 120L1 and the second bottom structure 120L2 may be generally the same as those described with respect to the bottom structure 120 with reference to FIG. 3A. For example, the to-be-etched layer 130 may have different levels of top surfaces from each other in the first and second areas AR1 and AR2.

Referring to FIG. 4B, the hardmask structure 140 and the photoresist layer 150 may be formed on the to-be-etched layer 130 in the same method as that described with reference to FIG. 3B, and then, the photoresist pattern 150P may be formed by exposing and developing the photoresist layer 150 in the same method as that described with reference to FIG. 3C.

Referring to FIG. 4C, by performing processes described with reference to FIGS. 3D through 3M on a resultant product of FIG. 4B, the feature pattern 130P may be formed on the first bottom structure 120L1 and the second bottom structure 120L2. A portion of the feature pattern 130P on the first bottom structure 120L1 in the first area AR1 may constitute the plurality of island patterns PA illustrated in FIG. 2A, and a portion of the feature pattern 130P on the second bottom structure 120L2 in the second area AR2 may constitute the plurality of line patterns PB illustrated in FIG. 2B.

In example embodiments, by over-etching in the etching process for forming the feature pattern 130P, a recess area LR1 may be formed on a top surface of the first bottom structure 120L1 and a recess area LR2 may be formed on a top surface of the second bottom structure 120L2. In some example embodiments, the recess areas (LR1 and LR2) may not be formed in at least one of the first area AR1 and the second area AR2.

Figure 5A:
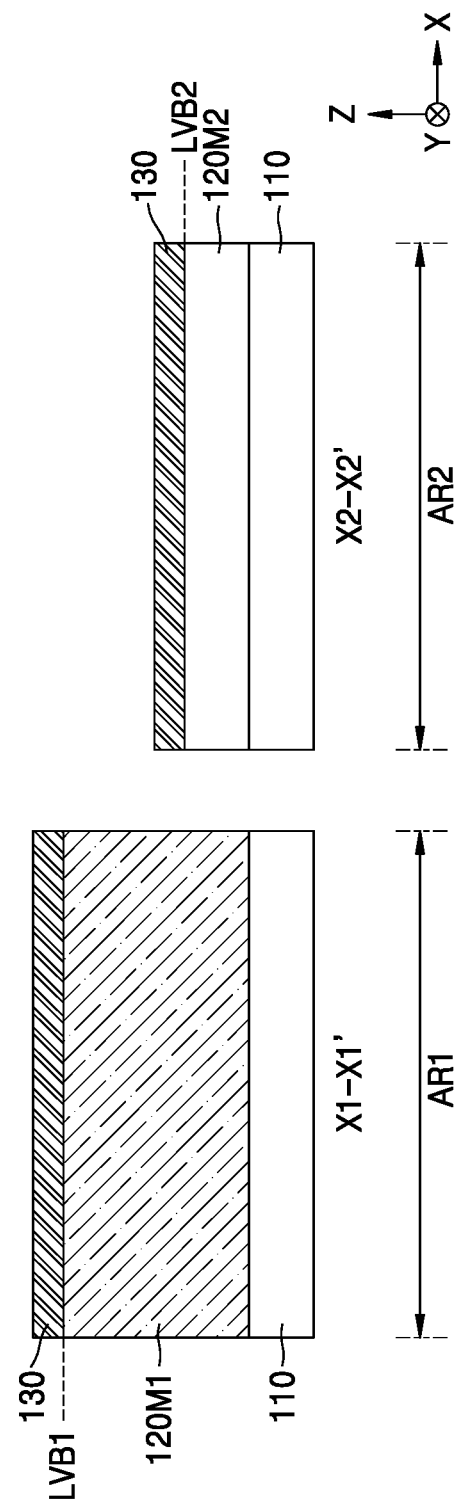
FIGS. 5A through 5C are cross-sectional views illustrating a method of forming patterns according to a process order, according to some embodiments of the inventive concept.
Figure 5B:
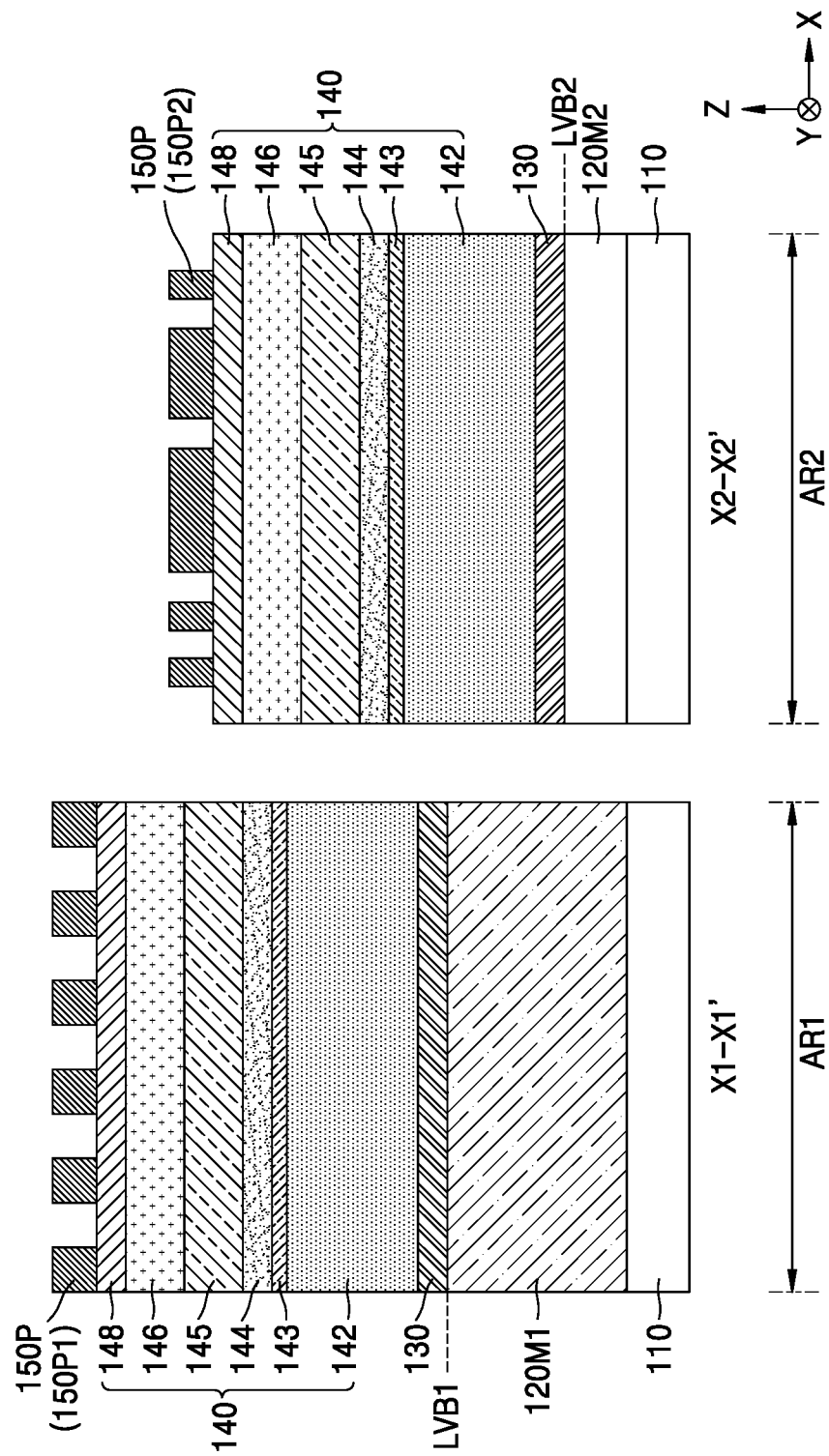
Figure 5C:
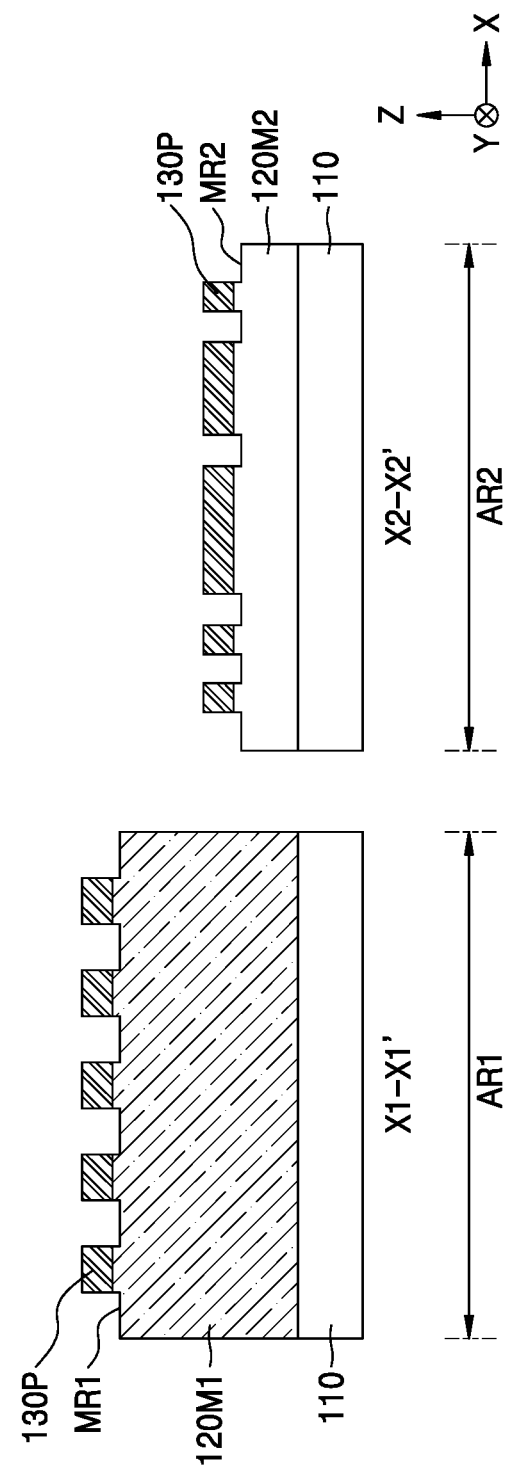

FIGS. 5A through 5C are cross-sectional views illustrating a method of forming patterns according to a process order, according to some embodiments of the inventive concept. Another method of forming the plurality of island patterns PA and the plurality of line patterns PB illustrated in FIGS. 2A and 2B is described with reference to FIGS. 5A through 5C. In FIGS. 5A through 5C, the same reference numerals as those in FIGS. 3A through 3M may denote the same members, and descriptions thereof are omitted here.

Referring to FIG. 5A, a first bottom structure 120M1 including a top surface of a first level LVB1 may be formed on the substrate 110 in the first area AR1, and a second bottom structure 120M2 including a top surface of a second level LVB2 may be formed on the substrate in the second area AR2. The first level LVB1 may be higher than the second level LVB2. For example, thicknesses of the first bottom structure 120M1 and the second bottom structure 120M2 may be different from each other, and the first bottom structure 120M1 may be thicker than the second bottom structure 120M2. The to-be-etched layer 130 may be formed on the first bottom structure 120M1 and the second bottom structure 120M2. More detailed configurations of the first bottom structure 120M1 and the second bottom structure 120M2 may be the same as those described with respect to the bottom structure 120 with reference to FIG. 3A.

Referring to FIG. 5B, the hardmask structure 140 and the photoresist layer 150 may be formed on the to-be-etched layer 130 in the same method as that described with reference to FIG. 3B, and then, a photoresist pattern 150P including a first photoresist pattern 152P1 and a second photoresist pattern 150P2 may be formed by exposing and developing the photoresist layer 150 in the same method as that described with reference to FIG. 3C.

Referring to FIG. 5C, by performing processes described with reference to FIGS. 3D through 3M on a resultant product of FIG. 5B, the feature pattern 130P may be formed on the first bottom structure 120M1 and the second bottom structure 120M2. A portion of the feature pattern 130P on the first bottom structure 120M1 in the first area AR1 may constitute the plurality of island patterns PA illustrated in FIG. 2A, and a portion of the feature pattern 130P on the second bottom structure 120M2 in the second area AR2 may constitute the plurality of line patterns PB illustrated in FIG. 2B.

In example embodiments, by over-etching in the etching process for forming the feature pattern 130P, a recess area MR1 may be formed on a top surface of the first bottom structure 120M1 and a recess area MR2 may be formed on a top surface of the second bottom structure 120M2. In some example embodiments, the recess areas (MR1 and MR2) may not be formed in at least one of the first area AR1 and the second area AR2.

According to the method of forming patterns according to embodiments of the inventive concept described with reference to FIGS. 3A through 3M, 4A through 4C, and 5A through 5C, in simultaneously forming patterns in a plurality of areas having different pattern densities from each other on the substrate 110, since an intaglio patterning is used in the first area AR1 having a relatively greater pattern density, an occurrence of a pattern defect, for example, a falling of the plurality of island patterns PA that are densely arranged at a relatively small pitch, or adjoining of adjacent island patterns PA to each other in the first area AR1 may be improved/prevented. For example, when small-sized photoresist island patterns are formed on a substrate, the small-sized photoresist island patterns may be collapsed/fallen and/or adjoining to each other so that the small-sized photoresist patterns may not have clear boundaries, which may lead to form unintended shape of patterns formed by using the small-sized photoresist patterns in a later step. Therefore, forming a negative mask pattern having an inverse plan view pattern of a target pattern with a photoresist layer which does not include small-sized photoresist patterns, and forming a positive mask pattern (e.g., a positive hardmask pattern) having an identical plan view pattern using the negative mask pattern in a later step as shown above may be helpful to form a pattern in a photolithography process. In addition, since an embossed patterning is used in the second area AR2 having a relatively small pattern density, the plurality of line patterns PB that have various widths and are apart from each other with various spaces therebetween may be easily formed into a desired shape. In addition, according to the method of forming patterns according to the technical idea of the inventive concept, by using only once an exposure process that is simple and requires a relatively low cost, various shapes and various sizes of patterns may be simultaneously formed in a plurality of areas having different pattern densities from each other. In addition, even when there is a pattern density difference, a pattern shape difference, a pattern size difference, or a pattern level difference between the plurality of areas, process difficulty due to these differences may not increase, undesired skew or scatter degradation may not occur in patterns that are simultaneously formed in the plurality of areas, or a process failure may not occur or may be improved, and accordingly, a design freedom may be improved and process margins may be increased.

Figure 6:
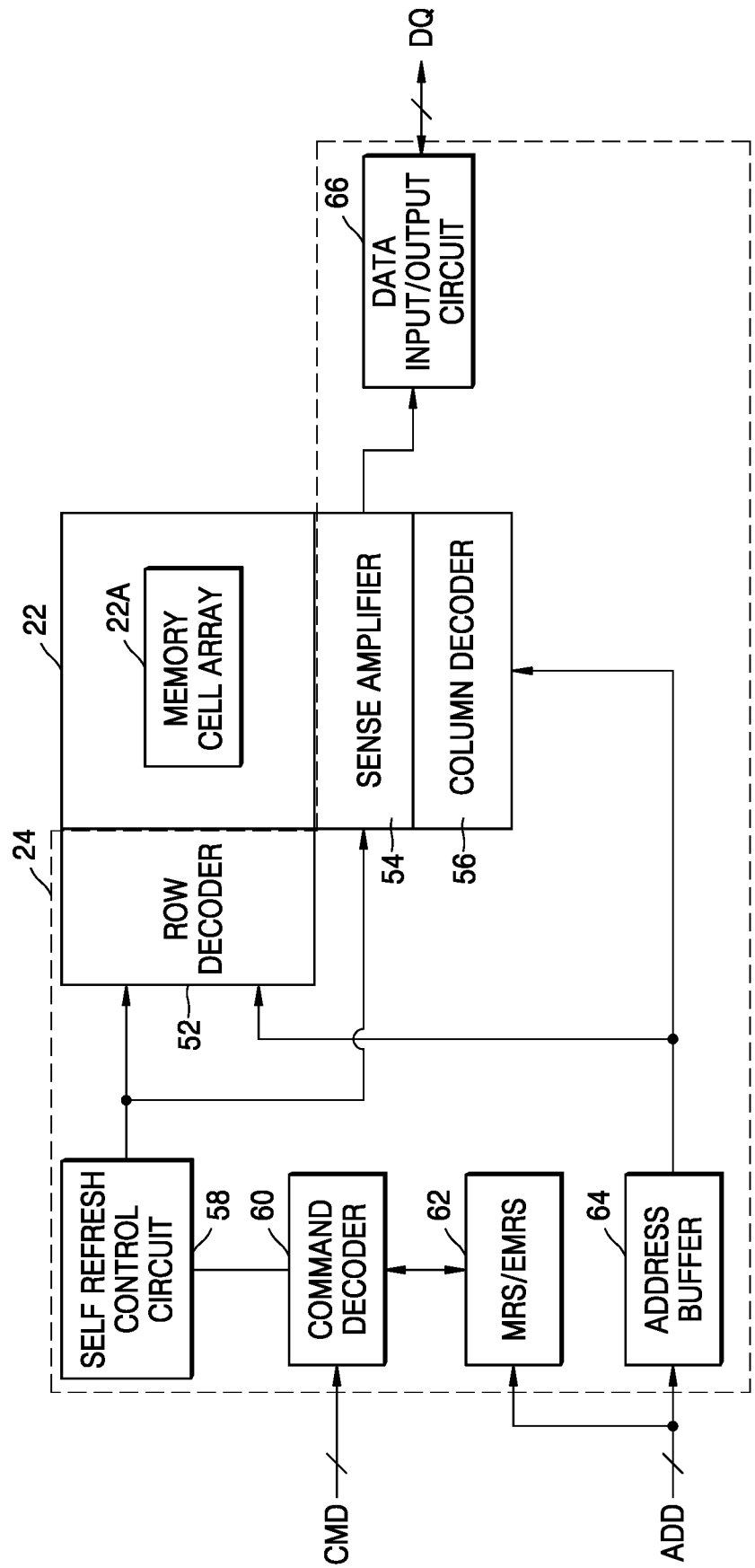
FIG. 6 is a block diagram illustrating an example configuration of an integrated circuit device, according to the technical idea of the inventive concept.

FIG. 6 is a block diagram illustrating an example configuration of an integrated circuit device 200, according to the technical idea of the inventive concept.

Referring to FIG. 6, the integrated circuit device 200 may include a first area 22 and a second area 24. The first area 22 may be a memory cell area of a DRAM device, and the second area 24 may be a peripheral circuit area of the DRAM device. The first area 22 may include a memory cell array 22A. The second area 24 may include a row decoder 52, a sense amplifier 54, a column decoder 56, a self-refresh control circuit 58, a command decoder 60, and a mode register set/extended mode register set (MRS/EMRS) circuit 62, an address buffer 64, and a data input/output circuit 66.

Figure 7:
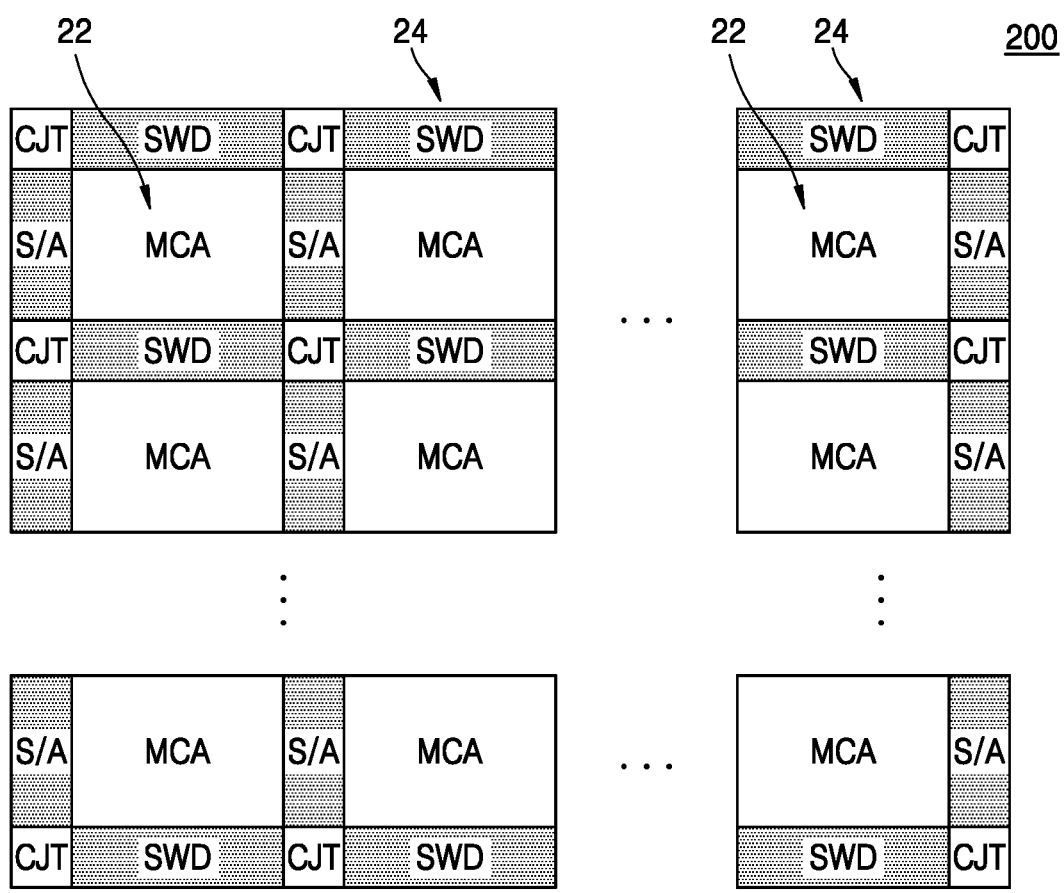
FIG. 7 is a block diagram illustrating an example arrangement configuration of an integrated circuit device, according to the technical idea of the inventive concept.

FIG. 7 is a plan view illustrating an example arrangement of the integrated circuit device 200 illustrated in FIG. 6.

Referring to FIG. 7, the integrated circuit device 200 may include a plurality of first areas 22. Each of the plurality of first areas 22 may be surrounded by the second area 24.

Each of the plurality of first areas 22 may be a cell array area MCA of the DRAM device, and the second area 24 may be a core area in which peripheral circuits of the DRAM device are formed (hereinafter, referred to as a "peripheral circuit area"). In the plurality of first areas 22, the cell array area MCA may include the memory cell array 22A described with reference to FIG. 6.

The second area 24 may include a sub-word line driver block SWD, a sense amplifier block S/A, and a conjunction block CJT. A plurality of bit line sense amplifiers may be in the sense amplifier block S/A. For example, each sense amplifier may amplify data read from memory cells through a corresponding bit line to recognizable logic levels. The sub-word line driver block SWD may include a sub-word line driver which selects a word line connected to memory cells when information is stored in or read from the memory cells. The conjunction block CJT may be at an intersection of the sub-word line driver block SWD and the sense amplifier block S/A. Power drivers and ground drivers for driving a bit line sense amplifier may be alternately arranged in the junction block CJT. In the second area 24, peripheral circuits such as an inverter chain and an input/output circuit may be further formed.

Figure 8A:
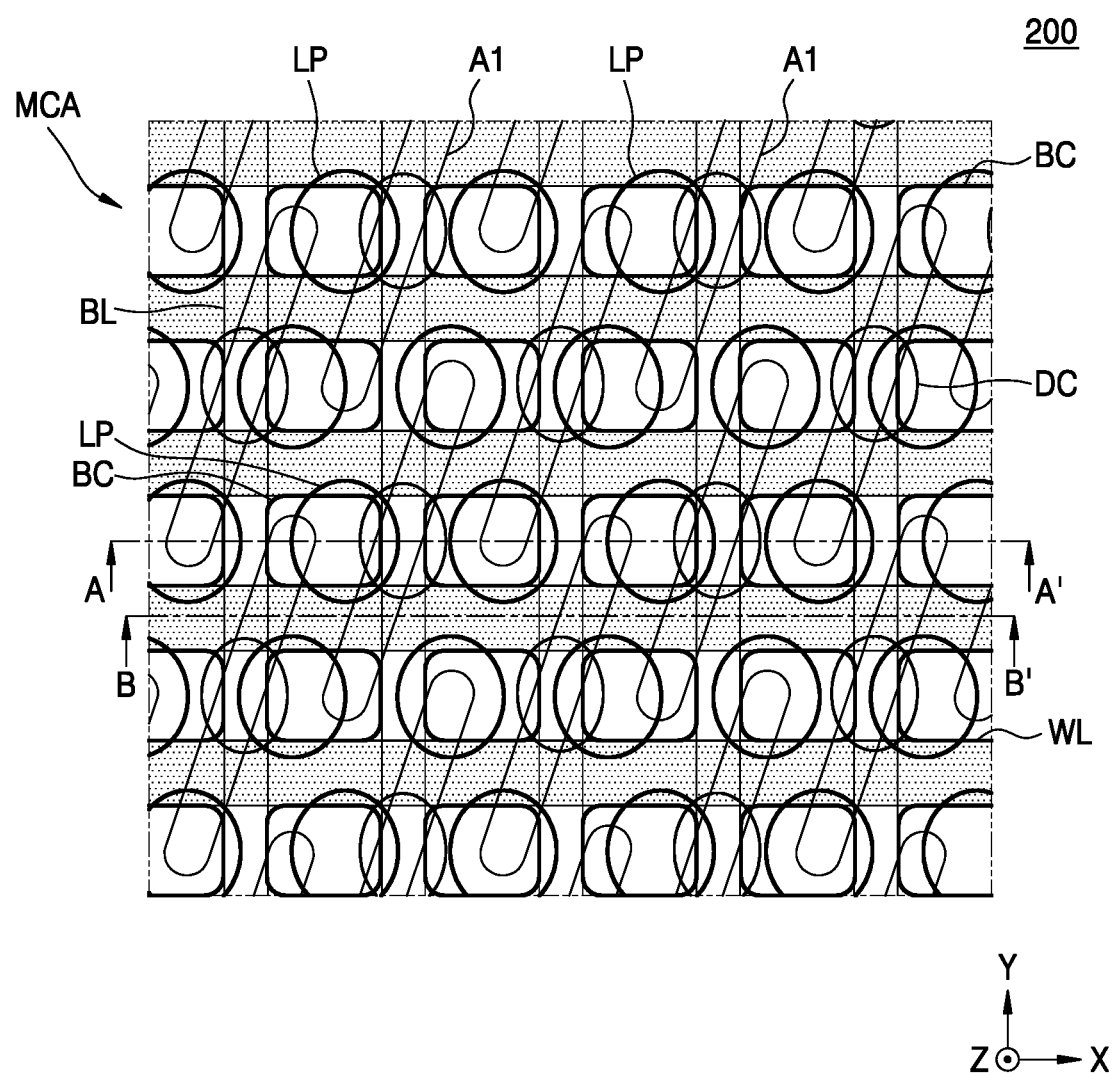
FIG. 8A is a schematic planar layout of main components of a cell array area of an interacted circuit device, according to the technical idea of the inventive concept.

FIG. 8A is a schematic planar layout of main components of the cell array area MCA illustrated in FIG. 7.

Referring to FIG. 8A, the cell array area MCA may include a plurality of cell active areas A1. Each of the plurality of cell active areas A1 may have a long axis in an oblique direction with respect to the X-direction and the Y-direction. For example, each of the cell active areas A1 may extend in an inclined direction with respect to word lines WL and bit lines BL in a plan view. A plurality of word lines WL may extend in parallel with each other in the X-direction across the plurality of cell active areas A1. The plurality of bit lines BL may extend in parallel with each other in the Y-direction on the plurality of word lines WL. The plurality of bit lines BL may be connected to the plurality of cell active areas A1 via direct contacts DC. A plurality of buried contacts BC may be between two adjacent bit lines BL among the plurality of bit lines BL. The plurality of buried contacts BC may be arranged in a line in the X-direction and in a line in the Y-direction. For example, the buried contacts BC may be arranged in rows and columns in a plan view as elements arranged in a matrix. A plurality of conductive landing pads LP may be formed on the plurality of buried contacts BC. The plurality of buried contacts BC and the plurality of conductive landing pads LP may connect bottom electrodes of capacitors (not shown) formed on top portions of the plurality of bit lines BL to the plurality of cell active areas A1. The plurality of conductive landing pads LP may partially overlap the plurality of buried contacts BC, respectively.

Figure 8B:
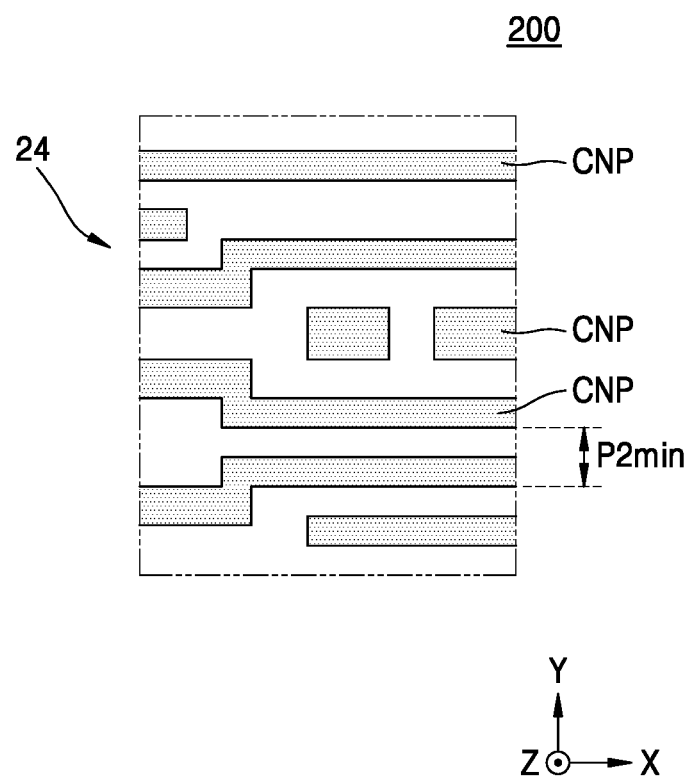
FIG. 8B is a schematic planar layout of a plurality of conductive patterns in a second area of an integrated circuit device, according to the technical idea of the inventive concept.

FIG. 8B is a plan view of an example arrangement of a plurality of conductive patterns CNP in the second area 24 of the integrated circuit device 200 illustrated in FIGS. 6 and 7.

Some of the plurality of conductive patterns CNP may extend in parallel with each other. Some of the plurality of conductive patterns CNP may function as conductive pads for interconnecting a conductive area thereunder with a conductive area thereon. For example, the conductive pads may be electrically connected to conductive patterns formed on an upper layer or on a lower layer, e.g., through via holes. The plurality of conductive patterns CNP may be apart from each other with spaces of various sizes therebetween in the horizontal direction, for example, in the X-direction or the Y-direction. For example, two directly adjacent conductive patterns CNP may be spaced apart with different distances depending on positions in a plan view. For example, different pairs of directly adjacent conductive patterns CNP may be spaced apart with different distances depending in different places in a plan view. A minimum separation distance between two conductive patterns CNP adjacent to each other in some areas of the second area 24 may be a minimum feature size of the integrated circuit device 200. The minimum separation distance between two conductive patterns CNP adjacent to each other in other areas of the second area 24 may be several to several tens of times the minimum feature size of the integrated circuit device 200. A minimum pitch P2 min of the plurality of conductive patterns CNP may be about 30 nm to about 46 nm, for example, about 40 nm to about 45 nm. For example, the minimum feature size of the integrated circuit device 200 may be the least width of a pattern or the least distance between patterns formed in the integrated circuit device 200 or a similar size. For example, the minimum feature size of the integrated circuit device 200 may be 20 nm or less. In certain embodiments, the minimum feature size of the integrated circuit device 200 may be 15 nm or less. For example, the minimum pitch P2 min of the plurality of conductive patterns CNP may be the least pitch of the conductive patterns CNP formed in the same layer.

A horizontal direction width of each of the plurality of conductive patterns CNP, for example, an X-direction width and a Y-direction width, and a horizontal direction separation distance between the conductive patterns CNP, for example, an X-direction separation distance and a Y-direction separation may vary. A horizontal direction minimum separation distance between two adjacent conductive patterns CNP may be less or greater than the minimum pitch P2 min. For example, the second area 24 may include an area having the minimum horizontal separation distance of about 20 nm or less between two adjacent conductive patterns CNP and may also include an area having the minimum horizontal separation distance of about 20 nm or more, for example, about 40 nm or more. In certain embodiments, two adjacent conductive patterns formed in the second area 24 may be separated by less than 20 nm in some portions and may be separated by more than 40 nm in other portions in a plan view. The plurality of conductive patterns CNP may include a portion having a width direction size, that is, the X- or Y-direction size of about 20 nm or less, and a portion having a width direction size, that is, the X- or Y-direction size of about 20 nm or more, for example, about 40 nm or more. In certain embodiments, a conductive pattern CNP formed in the second area 24 may include a portion having a width less than 20 nm and another portion having a width more than 40 nm.

The plurality of conductive landing pads LP illustrated in FIG. 8A and the plurality of conductive patterns CNP illustrated in FIG. 8B may be simultaneously formed, e.g., with the same photo process and the same etching process.

Figure 9A:
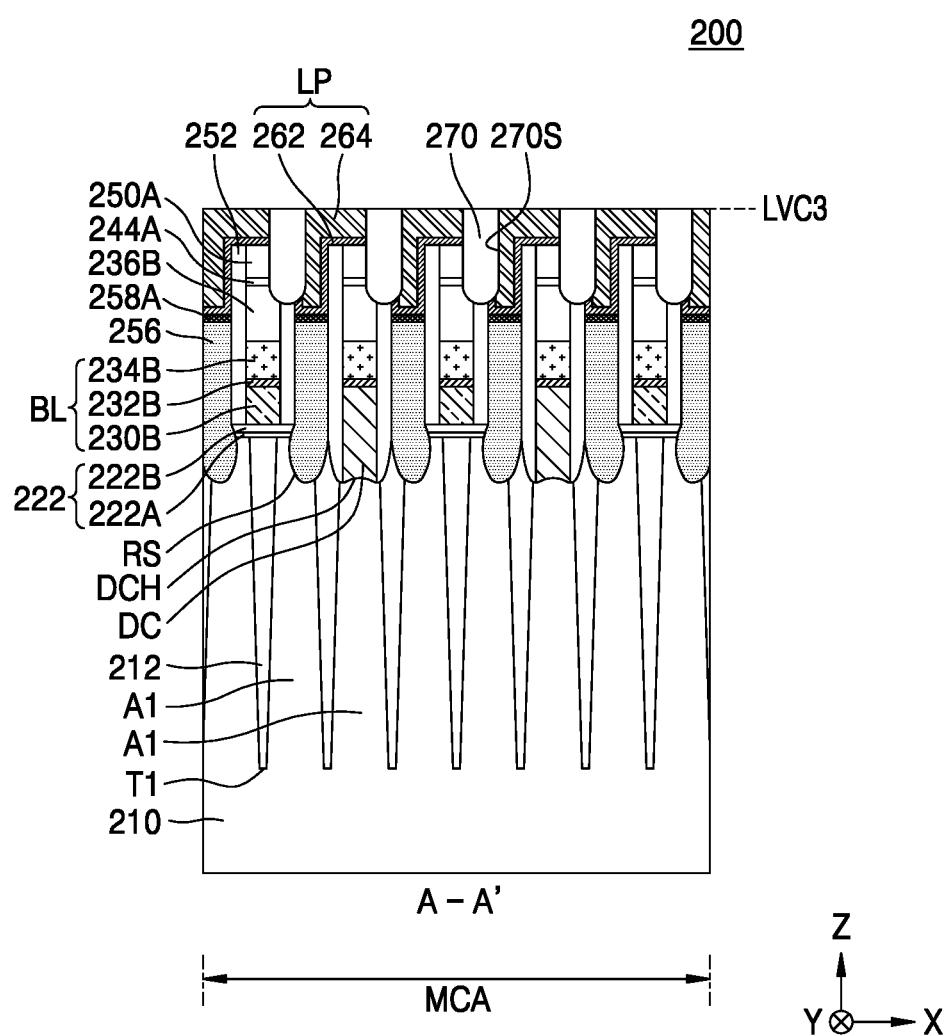
FIGS. 9A through 9C are cross-sectional views of example configurations of an integrated circuit device, according to the technical idea of the inventive concept.
Figure 9B:
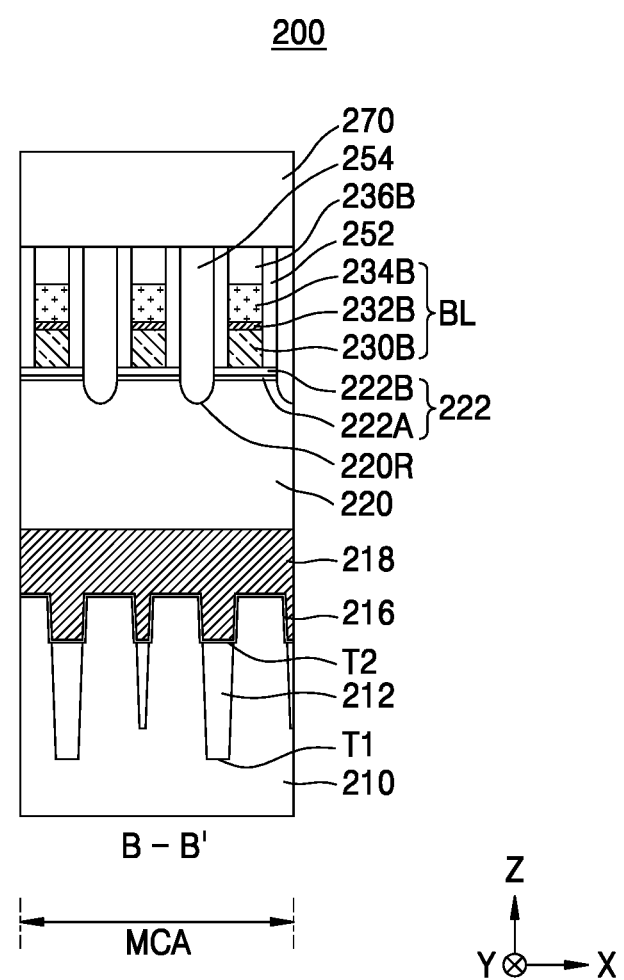
Figure 9C:
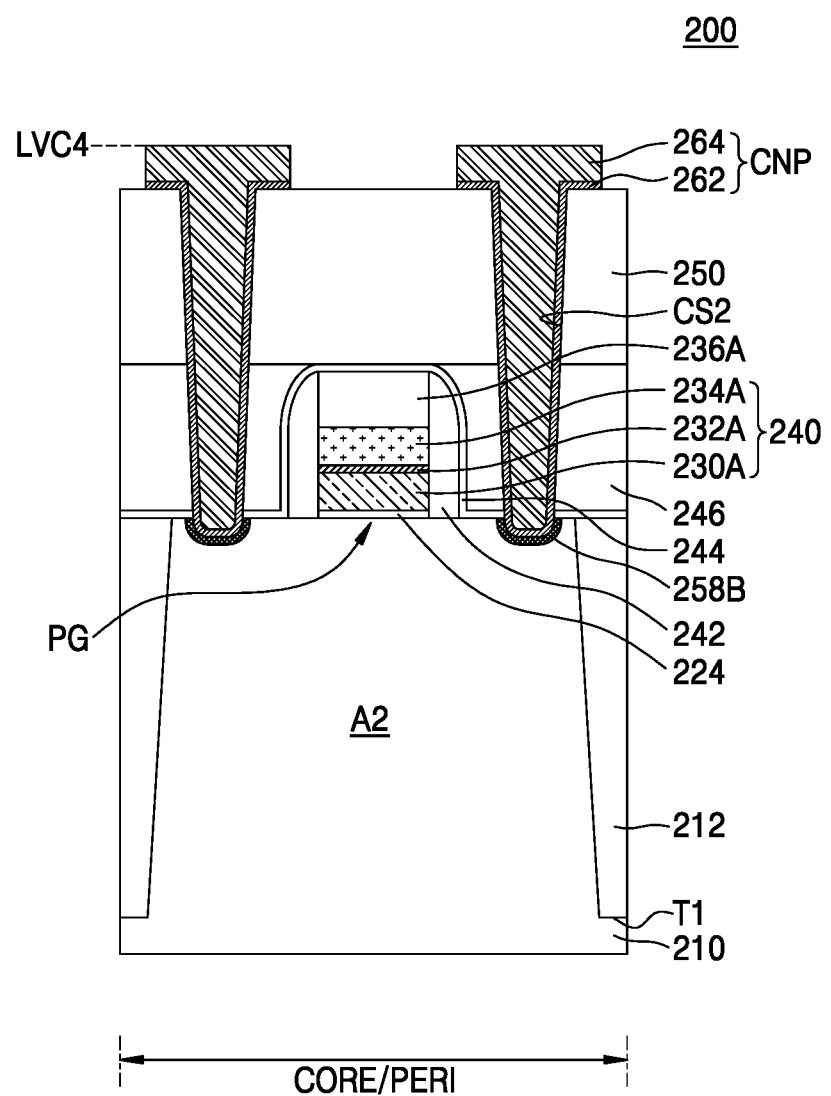

FIGS. 9A through 9C are cross-sectional views of example configurations of the integrated circuit device 200 illustrated in FIGS. 6, 7, 8A, and 8B. FIGS. 9A and 9B illustrate cross-sectional configurations of some areas of the cell array area MCA, and FIG. 9C illustrates a cross-sectional configuration of some area of a peripheral circuit area CORE/PERI. In particular, FIG. 9A illustrates the cross-sectional configuration of some area taken along line A-A' in FIG. 8A, and FIG. 9B illustrates the cross-sectional configuration of some area taken along line B-B' in FIG. 8A.

Referring to FIGS. 9A through 9C, the integrated circuit device 200 may include a substrate 210 having the cell array area MCA and the peripheral circuit area CORE/PERI. A device isolation trench T1 may be formed in the substrate 210, and a device isolation layer 212 may be formed in the device isolation trench T1. In the cell array area MCA, the plurality of cell active areas A1 may be defined in the substrate 210 by the device isolation layer 212, and in the peripheral circuit area CORE/PERI, a peripheral active area A2 may be defined in the substrate 210.

The substrate 210 may include silicon, for example, monocrystalline silicon, polycrystalline silicon, or amorphous silicon. In some embodiments, the substrate 210 may include at least one of Ge, SiGe, SiC, GaAs, InAs, and InP. In some embodiments, the substrate 210 may include a conductive area, for example, a well doped with an impurity, or a structure doped with an impurity. The device isolation layer 212 may include an oxide layer, a nitride layer, or a combination thereof. For example, the impurity may be an n-type dopant and/or a p-type dopant.

In the cell array area MCA, a plurality of word line trenches T2 extending in a first horizontal direction (X-direction) may be formed in the substrate 210, and in the plurality of word line trenches T2, a plurality of gate dielectric layers 216, a plurality of word lines 218, and a plurality of filling insulating layers 220 may be formed. The plurality of word lines 218 may correspond to the plurality of word lines WL illustrated in FIG. 8A. A plurality of recess spaces 220R may be formed on a top surface of the filling insulating layer 220. The plurality of gate dielectric layers 216 may include a silicon oxide layer, a silicon nitride layer, a silicon oxynitride layer, an oxide/nitride/oxide (ONO) layer, or a high-k dielectric layer having a higher dielectric constant than the silicon oxide layer. For example, the plurality of gate dielectric layers 216 may include $HfO_2$, $Al_2O_3$, $HfAlO_3$, $Ta_2O_3$, or $TiO_2$. The plurality of word lines 218 may include Ti, TiN, Ta, TaN, W, WN, TiSiN, WSiN, or a combination thereof. The plurality of filling insulating layers 220 may include a silicon oxide layer, a silicon nitride layer, a silicon oxynitride layer, or a combination thereof.

A buffer layer 222 may be formed on the substrate 210 in the cell array area MCA. The buffer layer 222 may include a first insulating layer 222A and a second insulating layer 222B. Each of the first insulating layer 222A and the second insulating layer 222B may include an oxide layer, a nitride layer, or a combination thereof. A plurality of direct contacts DC may be formed in a plurality of direct contact holes DCH on the substrate 210. The plurality of direct contacts DC may be connected to the plurality of cell active areas A1. The plurality of direct contacts DC may include Si, Ge, W, WN, Co, Ni, Al, Mo, Ru, Ti, TiN, Ta, TaN, Cu, or a combination thereof.

The plurality of bit lines BL may extend long in a second horizontal direction (Y-direction) on the substrate 210 and the plurality of direct contacts DC. Each of the plurality of bit lines BL may be connected to the cell active area A1 via the direct contact DC. Each of the plurality of bit lines BL may include a bottom conductive pattern 230B, an intermediate conductive pattern 232B, and a top conductive pattern 234B, which are sequentially stacked on the substrate 210. The bottom conductive pattern 230B may include doped polysilicon. Each of the intermediate conductive pattern 232B and the top conductive pattern 234B may include TiN, TiSiN, W, tungsten silicide, or a combination thereof. In certain example embodiments, the intermediate conductive pattern 232B may include TiN, TiSiN, or a combination thereof, and the top conductive pattern 234B may include W. Each of the plurality of bit lines BL may be covered by an insulating capping structure. The insulating capping structure may include a bottom insulating capping pattern 236B, an insulating thin layer pattern 244A, and a top insulating capping pattern 250A. Each of the bottom insulating capping pattern 236B, the insulating thin layer pattern 244A, and the top insulating capping pattern 250A may include silicon nitride. The plurality of bit lines BL and sidewalls of the insulating capping structure may be covered by a plurality of insulating spacers 252. The plurality of insulating spacers 252 may extend long in the Y-direction in parallel with the plurality of bit lines BL. The plurality of insulating spacers 252 may include an oxide layer, a nitride layer, an air spacer, or a combination thereof. In the present specification, the term "air" may be referred to as a space including the atmosphere or other gases that may be present during a manufacturing process. For example, the air spacer may be made of one or more gases and/or air composing the atmosphere.

A plurality of conductive plugs 256 and a plurality of insulating fences 254 may be arranged in a line in the Y-direction between the bit lines BL. The plurality of conductive plugs 256 may extend long in a vertical direction (Z-direction) from the recess space RS formed in the substrate 210. The plurality of insulating fences 254 may fill the plurality of recess spaces 220R formed on the top surface of the filling insulating layer 220 and may be arranged one by one between the conductive plugs 256. In the Y-direction, both sidewalls of each of the plurality of conductive plugs 256 may be covered by the plurality of insulating fences 254. The plurality of conductive plugs 256 arranged in a line in the Y-direction may be insulated from each other by the plurality of insulating fences 254. The plurality of insulating fences 254 may include a silicon nitride layer. The plurality of conductive plugs 256 may constitute the plurality of buried contacts BC illustrated in FIG. 8A.

On the plurality of conductive plugs 256, a plurality of metal silicide layers 258A and the plurality of conductive landing pads LP may be formed. The metal silicide layer 258A and the conductive landing pad LP may vertically overlap the conductive plug 256. The metal silicide layer 258A may include cobalt silicide, nickel silicide, or manganese silicide. Each of the plurality of conductive landing pads LP may be connected to the conductive plug 256 via the metal silicide layer 258A. For example, the conductive landing pads LP may be electrically connected to cell active areas A1 via the conductive plugs 256. The plurality of conductive landing pads LP may cover at least a portion of a top surface of the top insulating capping pattern 250A to vertically overlap a portion of the plurality of bit lines BL. Each of the plurality of conductive landing pads LP may include a conductive barrier layer 262 and a main conductive layer 264. The conductive barrier layer 262 may include Ti, TiN, or a combination thereof. The main conductive layer 264 may include a metal, metal nitride, conductive polysilicon, or a combination thereof. For example, the main conductive layer 264 may include W. The plurality of conductive landing pads LP may have a plurality of island-type pattern shapes in a plan view. The plurality of conductive landing pads LP may be electrically insulated from each other by insulating layers 270 filling insulating space 270S around the plurality of conductive landing pads LP. The insulating layer 270 may include a silicon oxide layer, a silicon nitride layer, or a combination thereof.

In the peripheral circuit area CORE/PERI, a gate structure PG may be formed on the peripheral active area A2. The gate structure PG may include a gate dielectric layer 224, a gate electrode 240, and a gate capping pattern 236A, which are sequentially stacked on the peripheral active area A2. The gate dielectric layer 224 may include at least one of a silicon oxide layer, a silicon nitride layer, a silicon oxynitride layer, an oxide/nitride/oxide (ONO) layer, and a high-k dielectric layer having a higher dielectric constant than the silicon oxide layer. The gate electrode 240 may include a bottom conductive pattern 230A, an intermediate conductive pattern 232A, and a top conductive pattern 234A. The bottom conductive pattern 230A, the intermediate conductive pattern 232A, and the top conductive pattern 234A may include the same constituting materials as the bottom conductive pattern 230B, the intermediate conductive pattern 232B, and the top conductive pattern 234B, which are included in the bit line BL in the cell array area MCA, respectively. The gate capping pattern 236A may include a silicon nitride layer.

Both sidewalls of the gate structure PG may be covered by an insulating spacer 242. The insulating spacer 242 may include an oxide layer, a nitride layer, or a combination thereof. The gate structure PG and the insulating spacer 242 may be covered by an insulating thin layer 244. The insulating thin layer 244 may include a silicon nitride layer. An interlayer insulating layer 246 may be formed around the gate structure PG on the insulating thin layer 244. The interlayer insulating layer 246 may include Tonen SilaZene (TOSZ), but is not limited thereto. The gate structure PG, the insulating thin layer 244, and the interlayer insulating layer 246 may be covered by a top insulating capping layer 250. The top insulating capping layer 250 may include a silicon nitride layer.

In the peripheral circuit area CORE/PERI, a contact space CS2 that penetrates through the top insulating capping layer 250, the interlayer insulating layer 246, and the insulating thin layer 244 in the vertical direction and extends to the peripheral active area A2 of the substrate 210 may be formed. The plurality of conductive patterns CNP may be formed on the top insulating capping layer 250. The plurality of conductive patterns CNP may extend in various planar shapes on the top insulating capping layer 250. The plurality of conductive patterns CNP may include a contact plug that penetrates through the top insulating capping layer 250, the interlayer insulating layer 246, and the insulating thin layer 244 via the contact space CS2 and extend in the vertical direction. The plurality of conductive patterns CNP may include the conductive barrier layer 262 and the main conductive layer 264, similarly to the plurality of conductive landing pads LP formed in the cell array area MCA. A metal silicide layer 258B may be between the peripheral active area A2 and the plurality of conductive patterns CNP. The metal silicide layer 258B may include cobalt silicide, nickel silicide, or manganese silicide.

FIGS. 10A through 10M are cross-sectional views illustrating a method of manufacturing the integrated circuit device 200 according to process sequences, according to the technical idea of the inventive concept. A method of manufacturing the integrated circuit device 200 illustrated in FIGS. 9A through 9C is described with reference to FIGS. 10A through 10M. In FIGS. 10A through 10M, section (a) is a cross-sectional view of some area of a portion taken along the line A-A' in FIG. 8A according to process sequences, and section (b) is a cross-sectional view of some components in the peripheral circuit area CORE/PERI according to the process sequences.

Figure 10A:
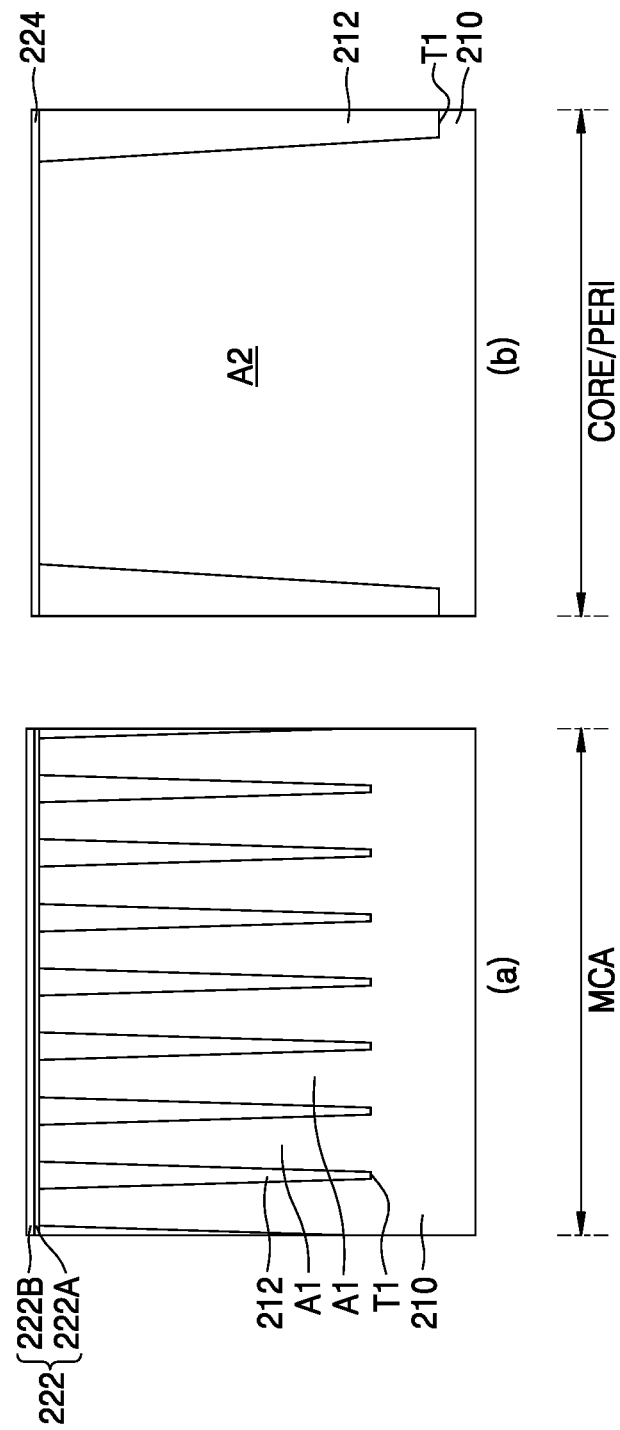
FIGS. 10A through 10M are cross-sectional views illustrating a method of manufacturing an integrated circuit device according to process sequences, according to the technical idea of the inventive concept.

Referring to FIG. 10A, the plurality of trenches T1 for device isolation and the plurality of device isolation layers 212 may be formed in the substrate 210 having the cell array area MCA and the peripheral circuit area CORE/PERI, and then, the plurality of cell active areas A1 may be defined in the cell array area MCA of the substrate 210, and the peripheral active area A2 may be defined in the peripheral circuit area CORE/PERI.

In the cell array area MCA, a plurality of word line trenches T2 (refer to FIG. 9B) that extend in parallel with the substrate 210 may be formed. After cleaning a resultant product in which the plurality of word line trenches T2 have been formed, the plurality of gate dielectric layers 216, the plurality of word lines 218, and the plurality of filling insulating layers 220 may be sequentially formed in the plurality of word line trenches T2. Impurity ions may be implanted into both sides of the plurality of word lines 218 in the plurality of cell active areas A1, and a plurality of source/drain areas may be formed on the plurality of cell active areas A1. In certain example embodiments, the plurality of source drain areas may be formed before the plurality of word lines 218 are formed.

Next, the buffer layer 222 may be formed on the substrate 210 in the cell array area MCA, and the gate dielectric layer 224 may be formed on the substrate 210 in the peripheral circuit area CORE/PERI.

Figure 10B:
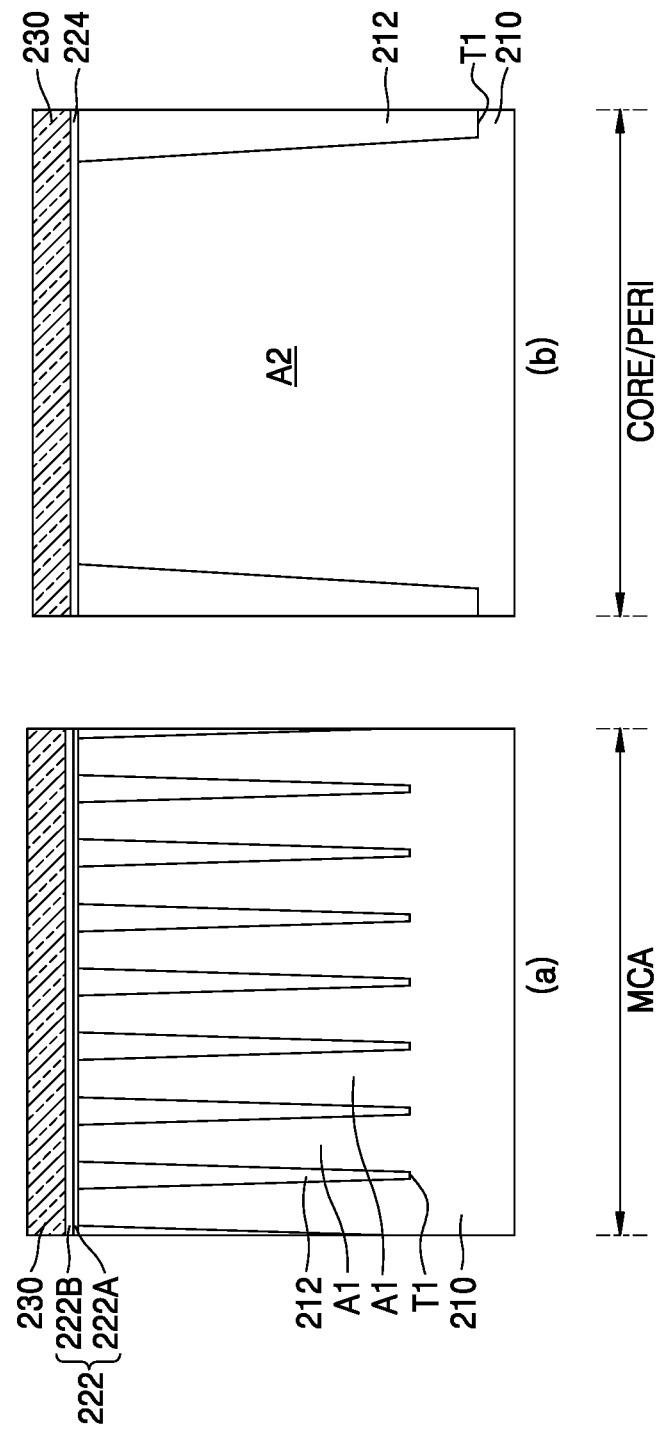

Referring to FIG. 10B, the bottom conductive layer 230 may be formed on the buffer layer 222 of the cell array area MCA and on the gate dielectric layer 224 of the peripheral circuit area CORE/PERI.

Figure 10C:
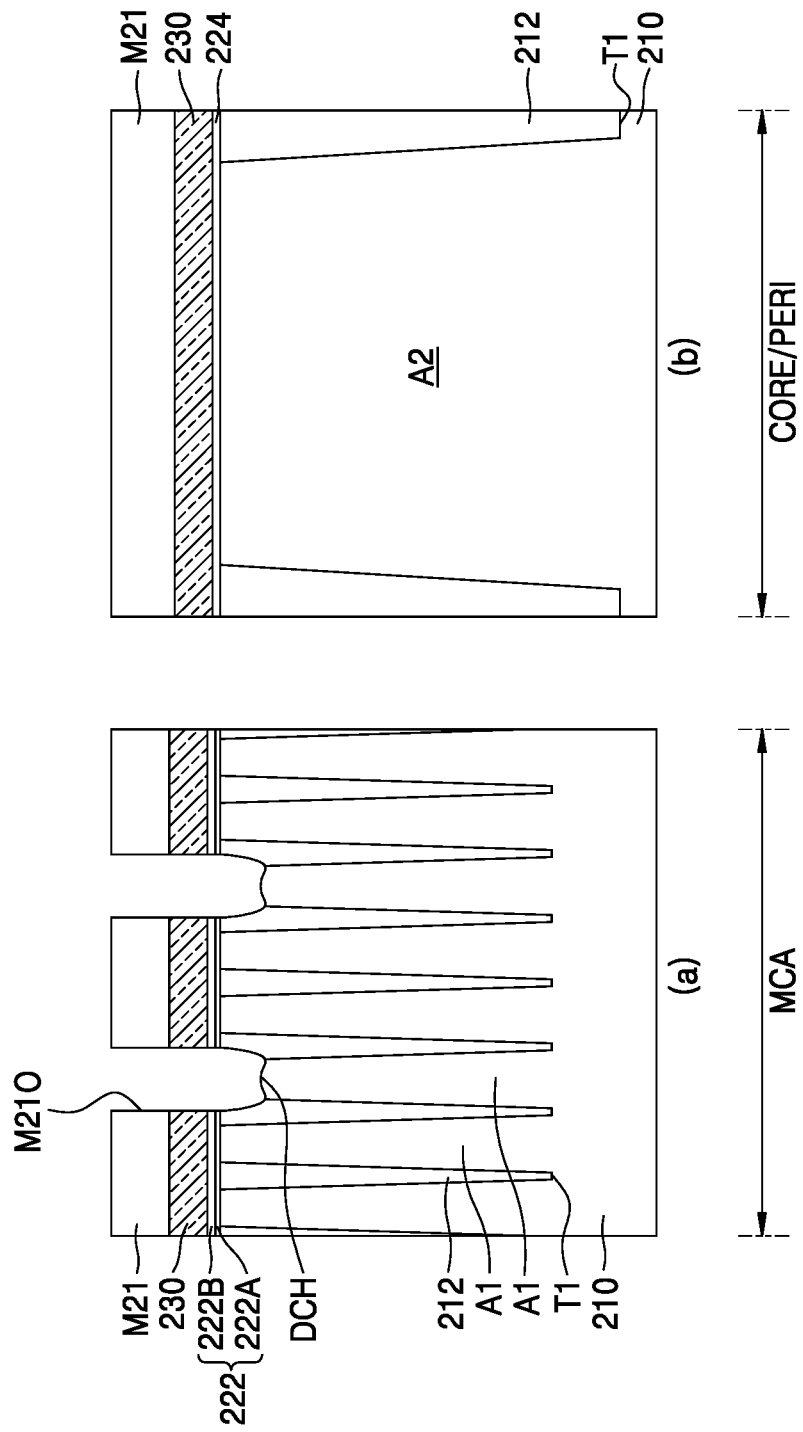

Referring to FIG. 10C, after the mask pattern M21 is formed on the bottom conductive layer 230, the bottom conductive layer 230 exposed via an opening M210 of the mask pattern M21 in the cell array area MCA may be etched, and by etching a portion of the substrate 210 and a portion of the device isolation layer 212 that are exposed as a result of the foregoing etching process, the direct contact hole DCH exposing the cell active area A1 of the substrate 210 may be formed. The mask pattern M21 may include an oxide layer, a nitride layer, or a combination thereof.

Figure 10D:
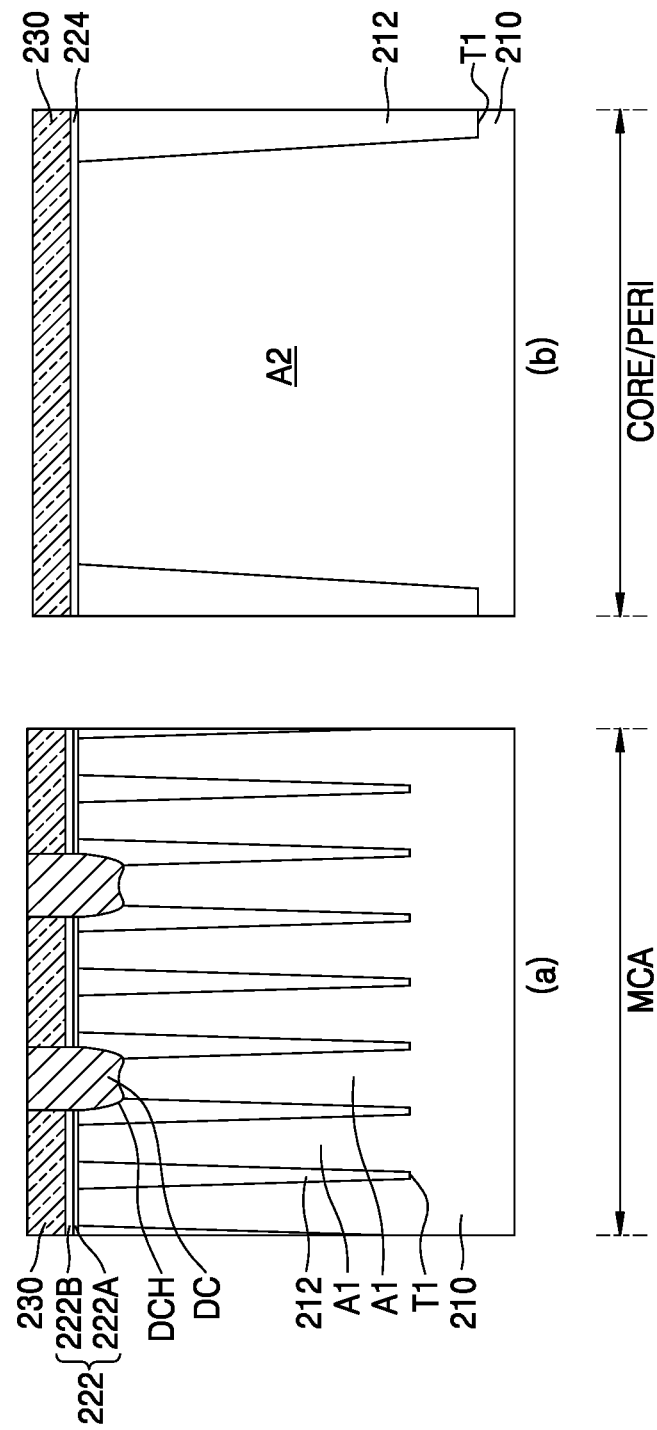

Referring to FIG. 10D, the mask pattern M21 (refer to FIG. 10C) may be removed, and the direct contact DC may be formed in the direct contact hole DCH. In an example process for forming the direct contact DC, a conductive layer having a thickness sufficient to fill the inside of the direct contact hole DCH and up to a top portion of the bottom conductive layer 230 may be formed, and then the conductive layer may be etch-backed such that the conductive layer remains only in the direct contact hole DCH. The conductive layer may include Si, Ge, W, WN, Co, Ni, Al, Mo, Ru, Ti, TiN, Ta, TaN, Cu, or a combination thereof.

Figure 10E:
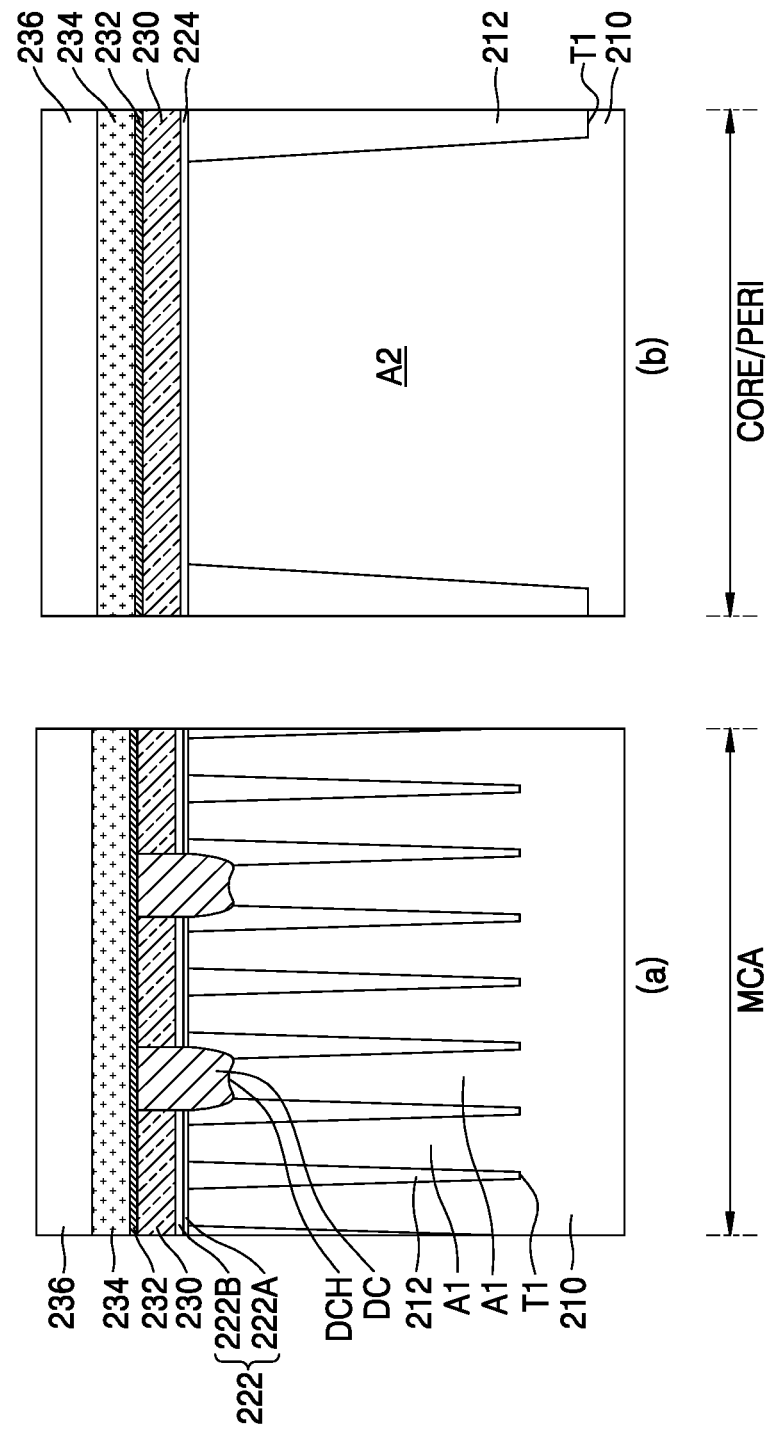

Referring to FIG. 10E, in the cell array area MCA and the peripheral circuit area CORE/PERI, the intermediate conductive layer 232, the top conductive layer 234, and the bottom insulating capping layer 236 may be sequentially formed on top surfaces of the bottom conductive layer 230 and the direct contact DC. Each of the intermediate conductive layer 232 and the top conductive layer 234 may include TiN, TiSiN, W, tungsten silicide, or a combination thereof. The bottom insulating capping layer 236 may include a silicon nitride layer.

Figure 10F:
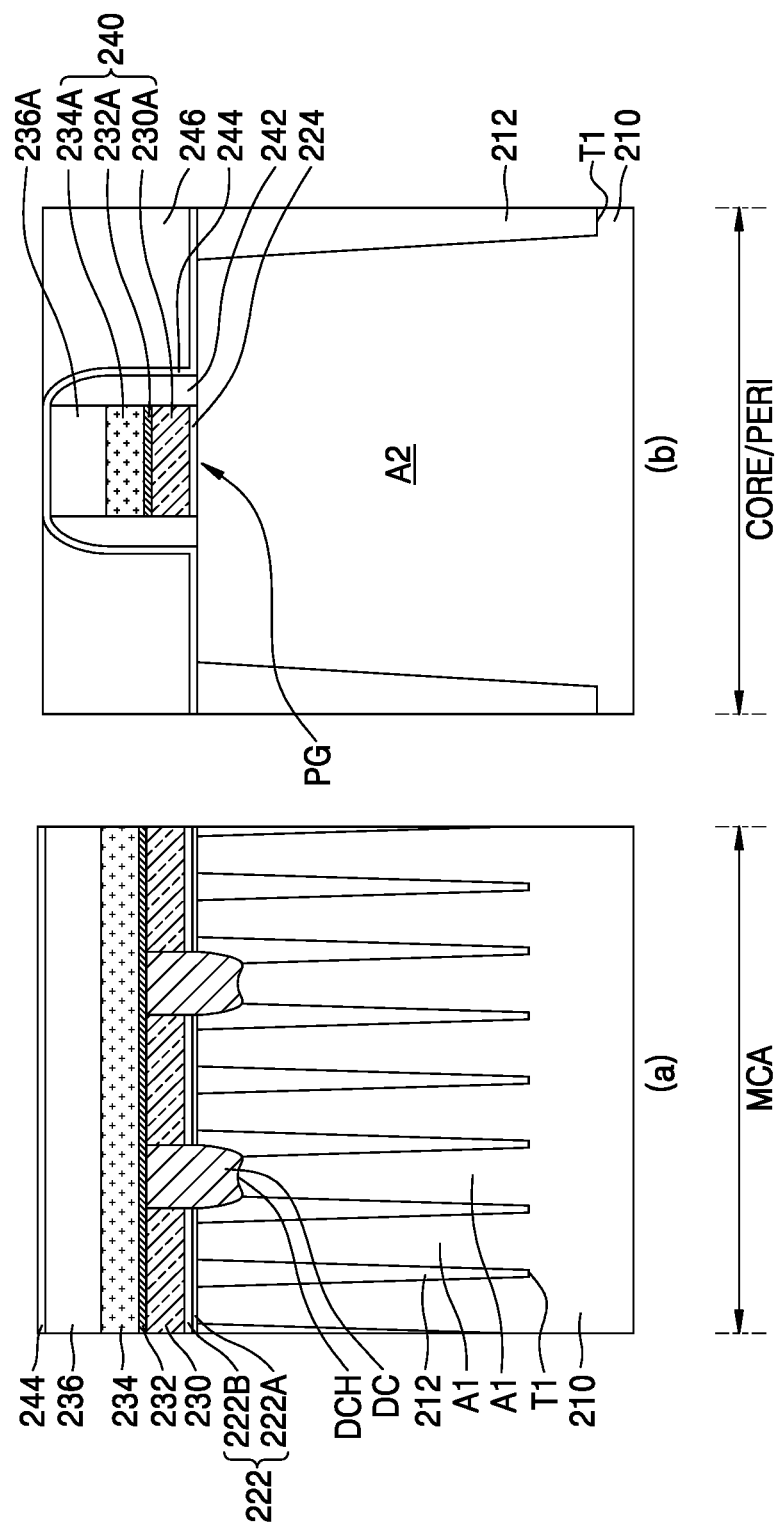

Referring to FIG. 10F, while the cell array area MCA is covered with a mask pattern (not shown), in the peripheral circuit area CORE/PERI, the gate dielectric layer 224, the bottom conductive layer 230, and the intermediate conductive layer 232, the top conductive layer 234, and the bottom insulating capping layer 236 may be patterned, and then, the gate electrode 240 including the bottom conductive pattern 230A, the intermediate conductive pattern 232A, and the top conductive pattern 234A, and the gate capping pattern 236A covering the gate electrode 240 may be formed on the gate dielectric layer 224. Next, the insulating spacer 242 may be formed on both sidewalls of the gate structure PG that is formed in a stacked structure including the gate dielectric layer 224, the gate electrode 240, and the gate capping pattern 236A, and then, the ion implanting process for forming the source/drain area on both sides of the gate structure PG in the peripheral active area A2 may be performed.

Next, the bottom insulating capping layer 236 may be exposed in the cell array area MCA by removing a mask pattern covering the cell array area MCA, the insulating thin layer 244 covering the entire surface of a resultant product that is exposed in the cell array area MCA and the peripheral circuit area CORE/PERI may be formed, and the interlayer insulating layer 246 filling the space around the gate structure PG may be formed in the peripheral circuit area CORE/PERI.

Figure 10G:
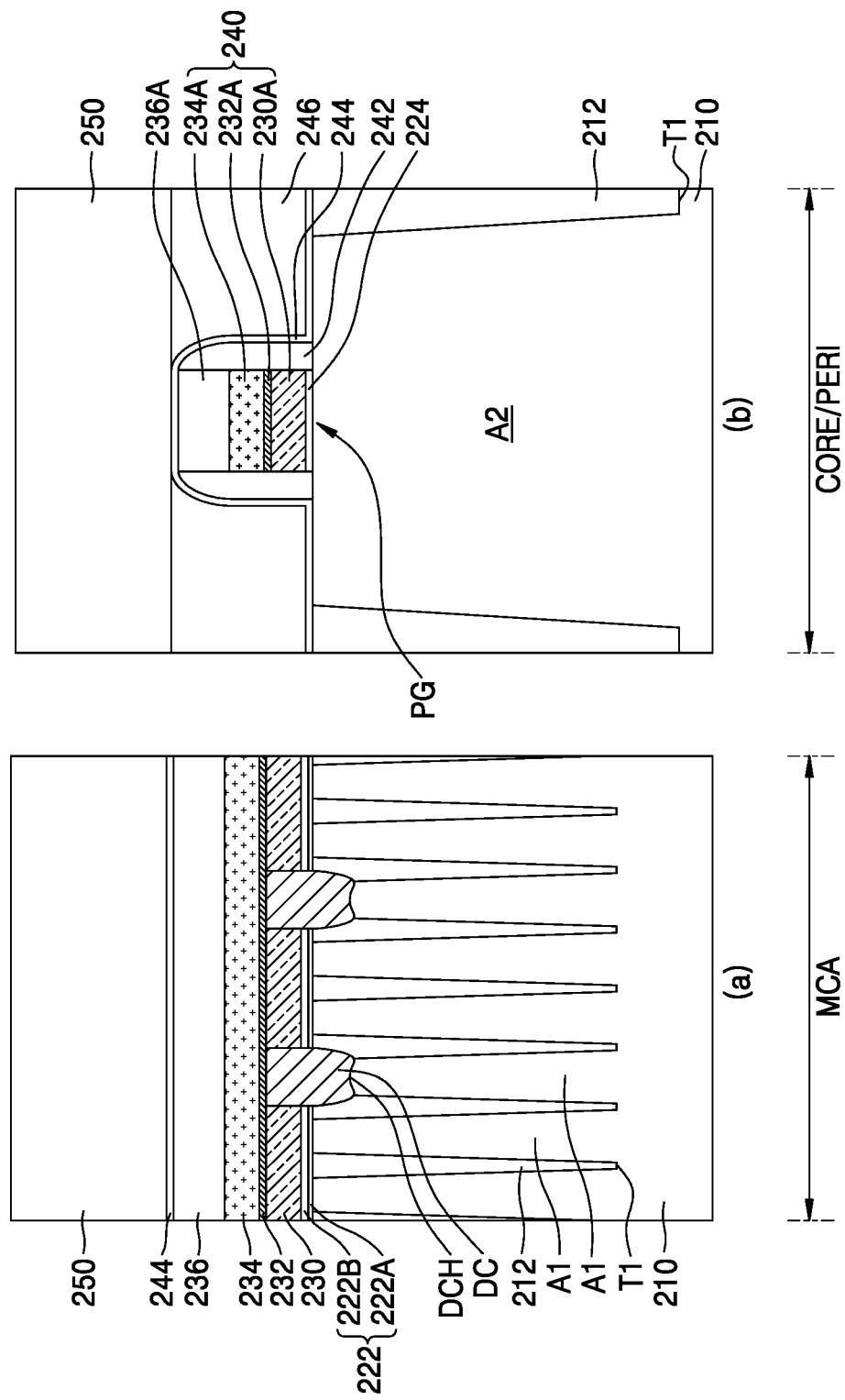

Referring to FIG. 10G, the top insulating capping layer 250 may be formed on the insulating thin layer 244 and the interlayer insulating layer 246 in the cell array area MCA and the peripheral circuit area CORE/PERI.

Figure 10H:
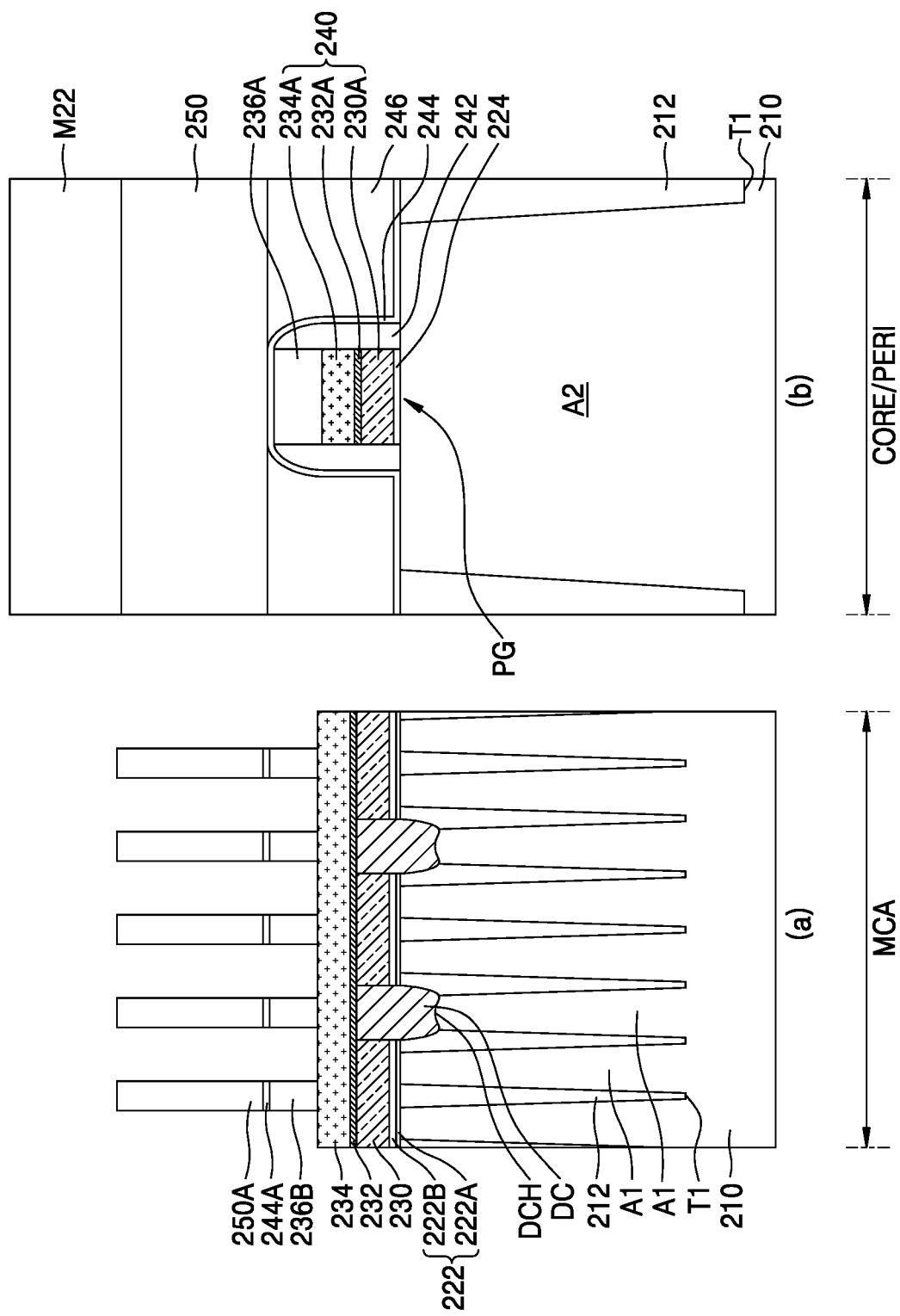

Referring to FIG. 10H, while the top insulating capping layer 250 is covered by the mask pattern M22 in the peripheral circuit area CORE/PERI, by using a photolithography process in the cell array area MCA, the top insulating capping layer 250, the insulating thin layer 244, and the bottom insulating capping layer 236 may be patterned, and the bottom insulating capping pattern 236B, the insulating thin layer pattern 244A, and the top insulating capping pattern 250A, that are sequentially stacked on the top conductive layer 234, may be formed.

Figure 10I:
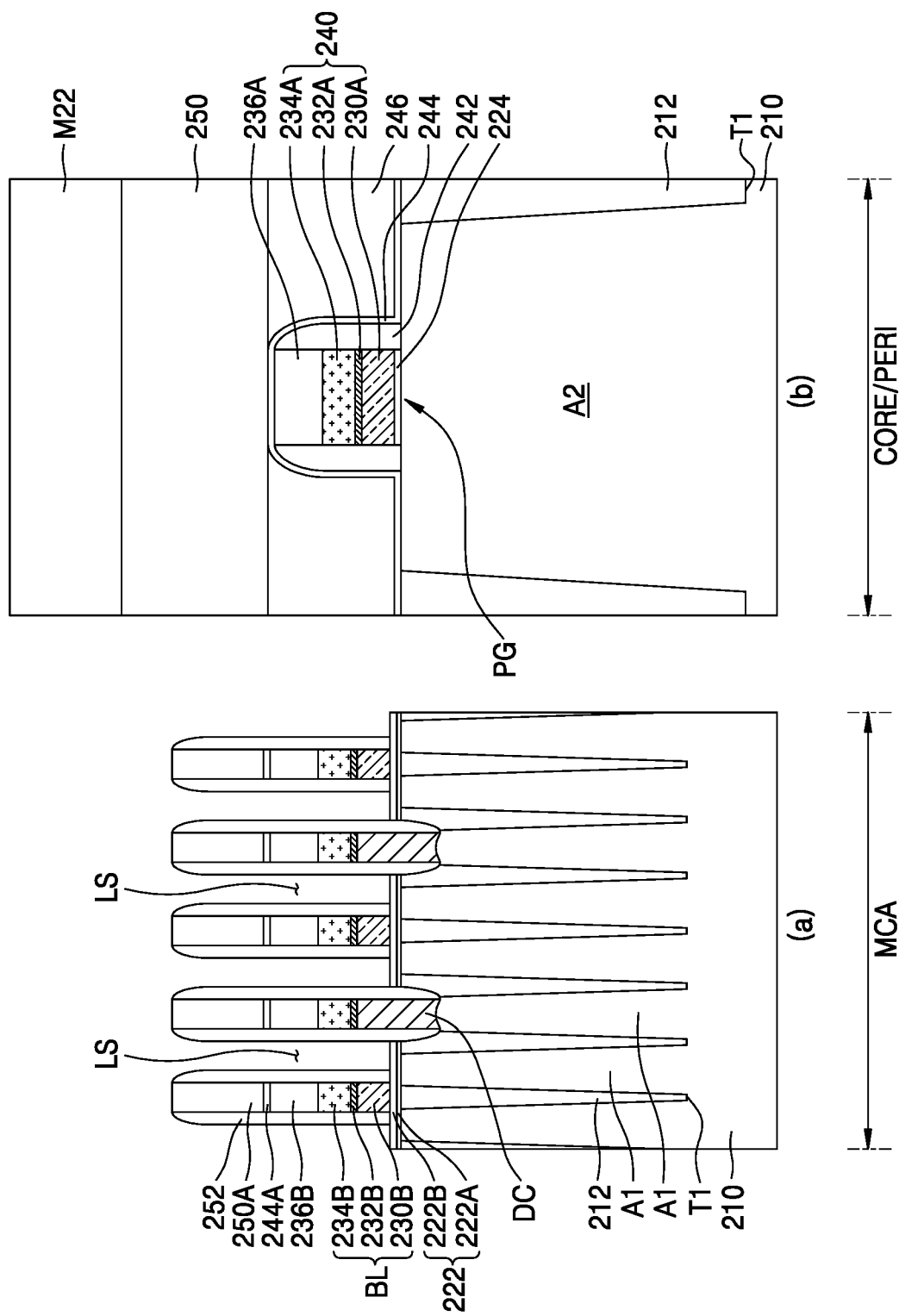

Referring to FIG. 10I, while the top insulating capping layer 250 is covered by the mask pattern M22 in the peripheral circuit area CORE/PERI, in the cell array area MCA, the top conductive layer 234, the intermediate conductive layer 232, and the bottom conductive layer 230 may be etched by using the bottom insulating capping pattern 236B, the insulating thin layer pattern 244A, and the top insulating capping pattern 250A as etching masks, the plurality of bit lines BL including the bottom conductive pattern 230B, the intermediate conductive pattern 232B, and the top conductive pattern 234B may be formed, and the plurality of insulating spacers 252 may be formed. The plurality of insulating spacers 252 may be formed to fill the direct contact holes DCH around the direct contacts DC. After the plurality of insulating spacers 252 are formed, line spaces LS may remain between the bit lines BL.

By the etching processes accompanied with forming of the plurality of bit lines BL and the plurality of insulating spacers 252, a height of the top insulating capping pattern 250A may be reduced by the etching processes involved.

Figure 10J:
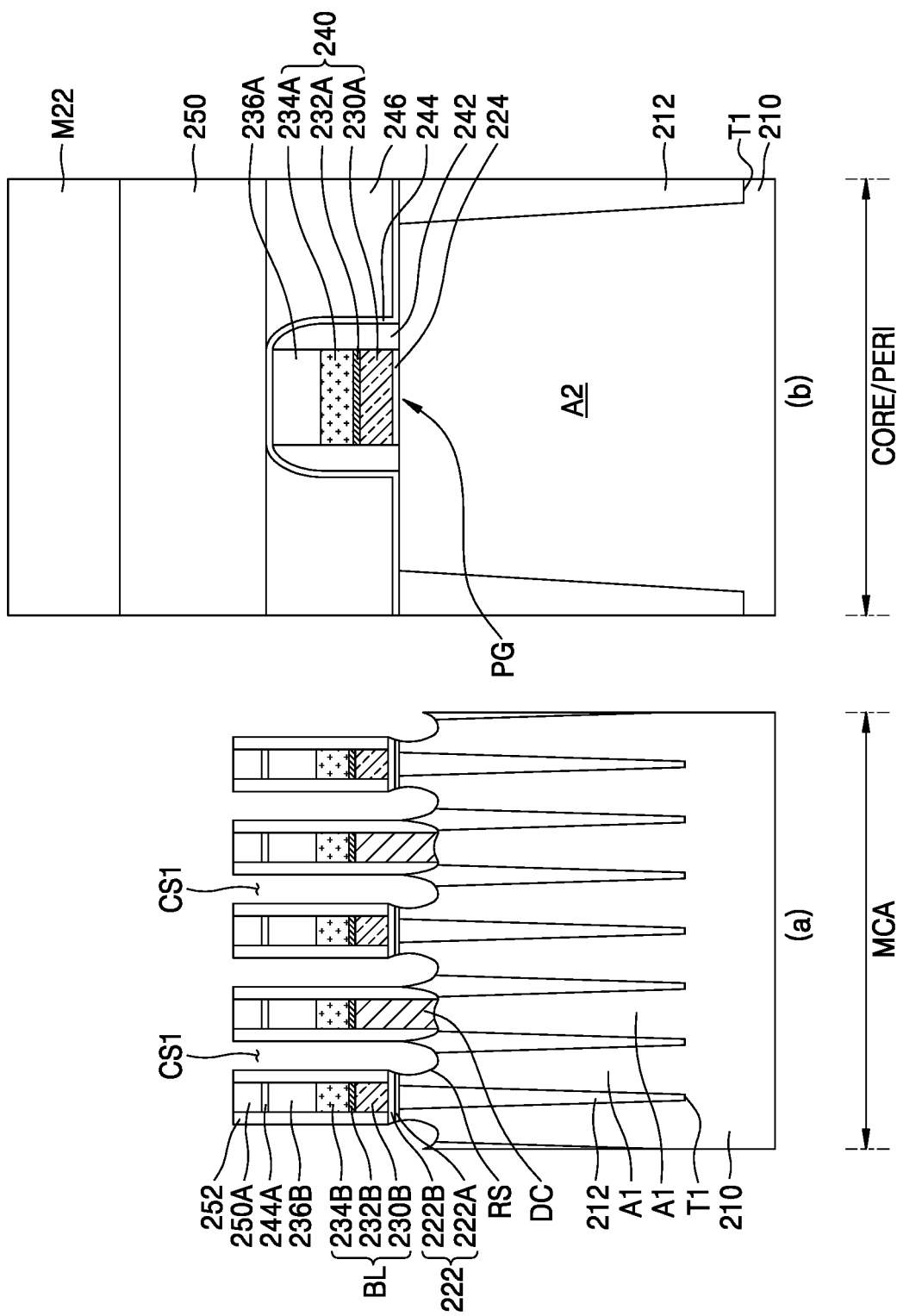

Referring to FIG. 10J, while the top insulating capping layer 250 is covered by the mask pattern M22 in the peripheral circuit area CORE/PERI, in the cell array area MCA, the line space LS may be divided into a plurality of contact spaces CS1 by forming the plurality of insulating fences 254 (refer to FIG. 9B) between the bit lines BL. The plurality of insulating fences 254 may vertically overlap the word lines 218, respectively. One line space LS may be divided into a plurality of contact spaces CS1 of a columnar shape by the plurality of insulating fences 254. As the top insulating capping pattern 250A and the insulating spacer 252 are exposed to the etching atmosphere accompanied with forming of the plurality of insulating fences 254, the top insulating capping pattern 250A and the insulating spacer 252 may be consumed, and heights thereof may be further reduced. Next, by removing a portion of structures that are exposed via the plurality of contact spaces CS1, the plurality of recess spaces RS that expose the cell active area A1 of the substrate 210 between the bit lines BL may be formed.

Figure 10K:
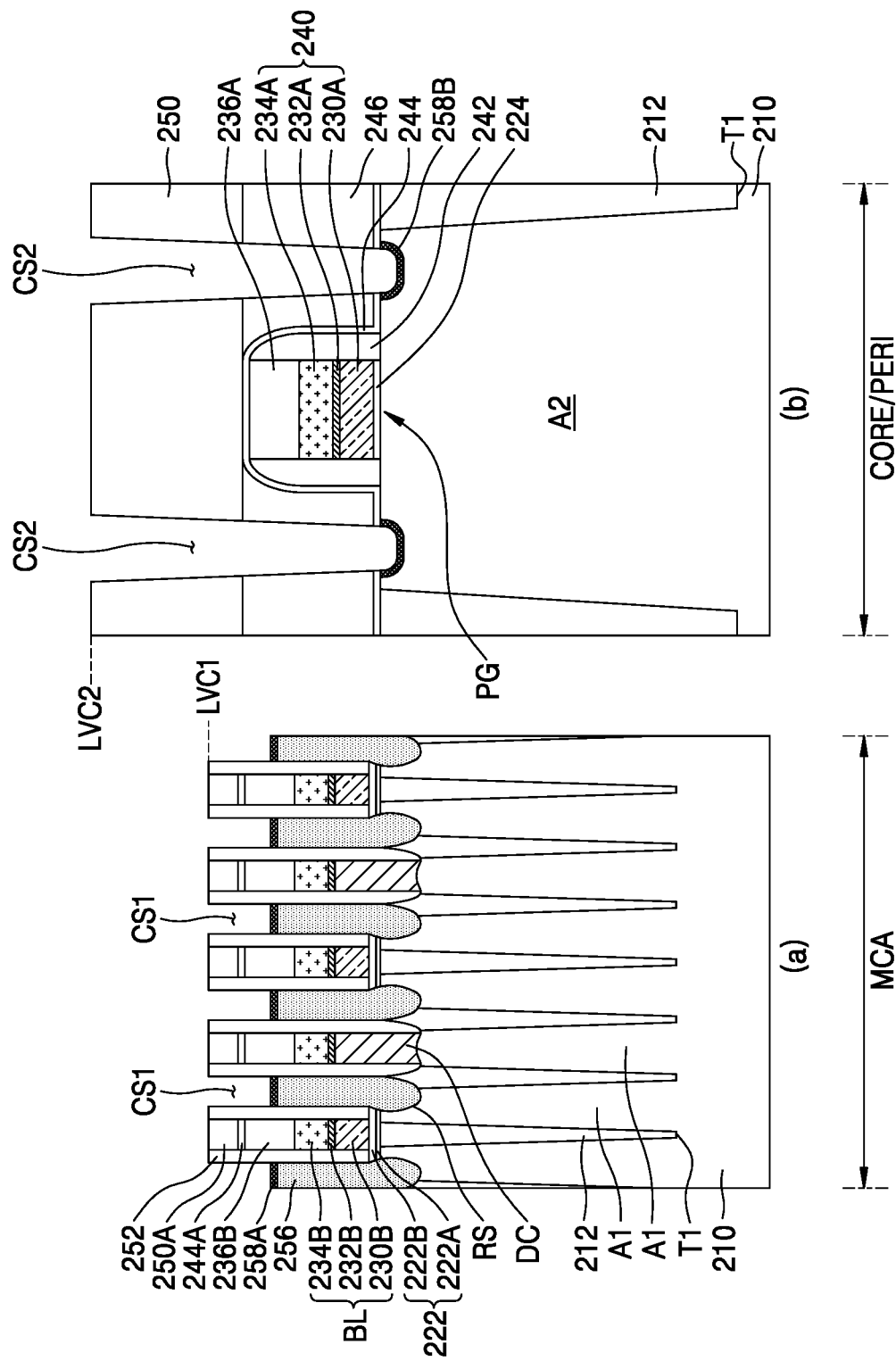

Referring to FIG. 10K, while the top insulating capping layer 250 is covered by the mask pattern M22 (refer to FIG. 10J) in the peripheral circuit area CORE/PERI, in the cell array area MCA, the plurality of conductive plugs 256 that fill the plurality of recess spaces RS between the bit lines BL and fill a portion of the contact space CS1 between the bit lines BL may be formed.

After the top insulating capping layer 250 is exposed by removing the mask pattern M22 in the peripheral circuit area CORE/PERI, while a mask pattern (not shown) covers the cell array area MCA, in the peripheral circuit area CORE/PERI, the plurality of contact spaces CS2 exposing the peripheral active area A2 of the substrate 210 may be formed by etching the top insulating capping layer 250, the interlayer insulating layer 246, and the insulating thin layer 244. For example, a photolithography process may be performed to form the contact spaces CS2. After the mask pattern (not shown) covering the cell array area MCA is removed, in the cell array area MCA, the metal silicide layer 258A may be formed on the conductive plug 256 that is exposed via the plurality of contact spaces CS1, and in the peripheral circuit area CORE/PERI, the metal silicide layer 258B may be formed on the surface of the peripheral active area A2 that is exposed via the plurality of contact spaces CS2. The metal silicide layers 258A and 258B may be formed at the same time or by separate processes.

The level LVC1 of the top surface of the top insulating capping pattern 250A constituting the uppermost surface in the cell array area MCA may be lower than the level LVC2 of the top surface of the top insulating capping layer 250 constituting the uppermost surface in the structure formed in the peripheral circuit area CORE/PERI. In this case, the term "level" may denote a vertical height from a top surface of the substrate 210.

Figure 10L:
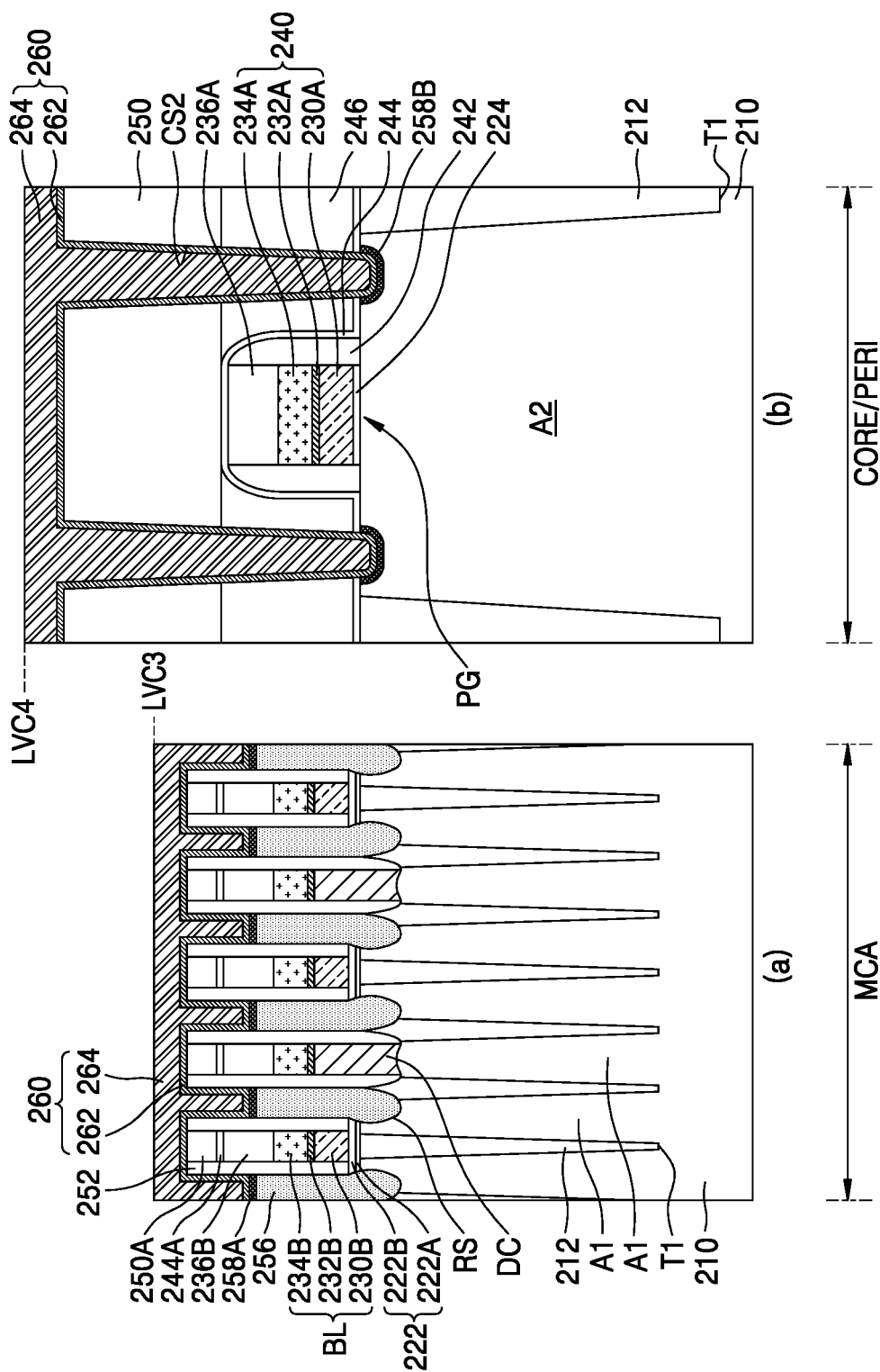

Referring to FIG. 10L, the conductive layer 260 covering the exposed surface on the substrate 210 may be formed in the cell array area MCA and the peripheral circuit area CORE/PERI. The conductive layer 260 may include the conductive barrier layer 262 and the main conductive layer 264. The level LVC3 of the top surface of a portion of the conductive layer 260 in the cell array area MCA may be lower than the level LVC4 of the top surface of a portion of the conductive layer 260 in the peripheral circuit area CORE/PERI.

Figure 10M:
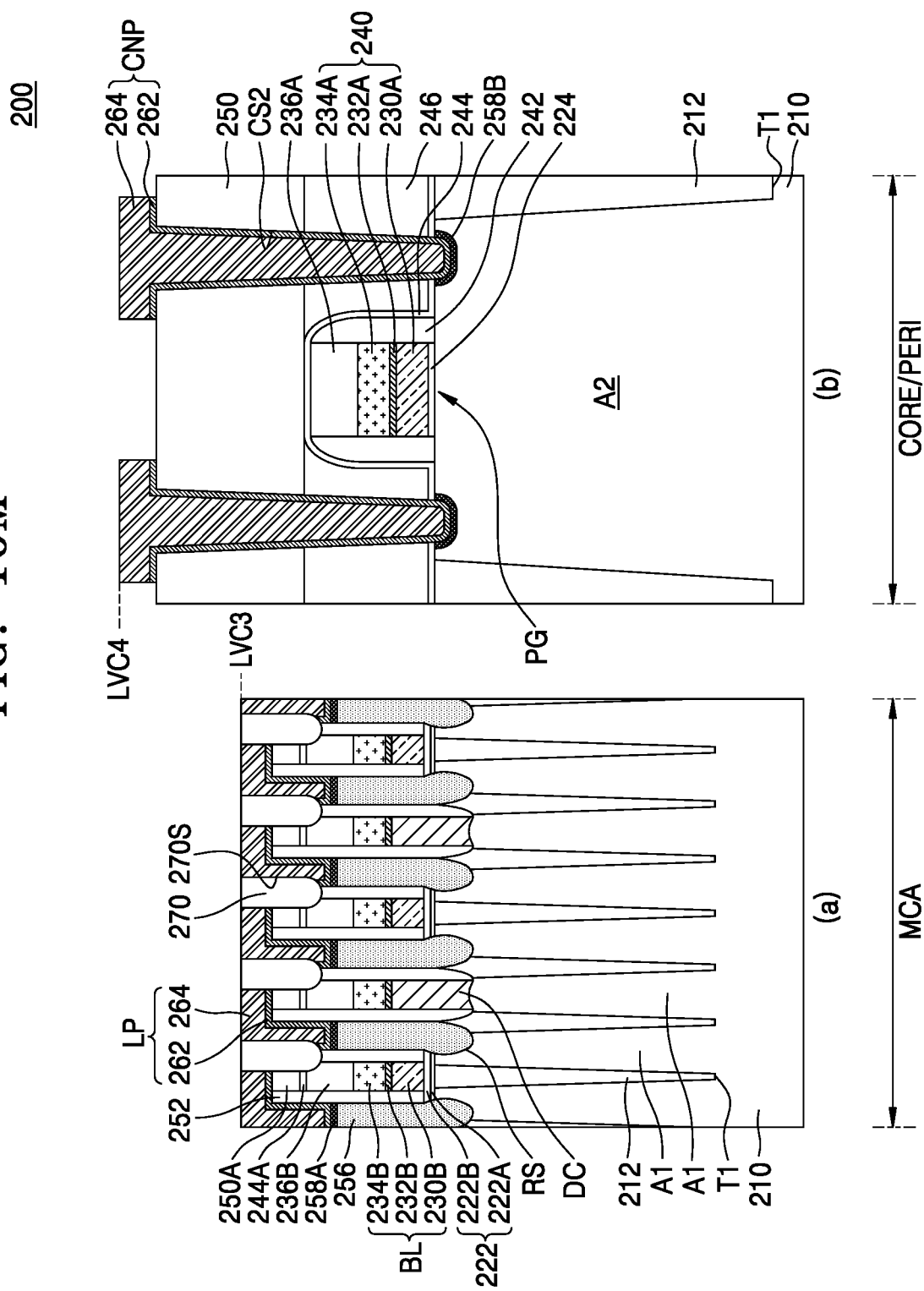

Referring to FIG. 10M, by using a similar method to that described with reference to FIGS. 3A through 3M, 4A through 4C, or 5A through 5C, and by patterning the conductive layer 260 simultaneously in the cell array area MCA and the peripheral circuit area CORE/PERI, the plurality of landing pads LP may be formed from the conductive layer 260 in the cell array area MCA, and the plurality of conductive patterns CNP may be formed from the conductive layer 260 in the peripheral circuit area CORE/PERI. The plurality of conductive landing pads LP may have a plurality of island-type pattern shapes in a plan view, as illustrated in FIG. 8A. The plurality of conductive landing pads LP may be formed to vertically overlap a portion of the plurality of bit lines BL and the metal silicide layer 258A. As illustrated in FIG. 8B, the plurality of conductive patterns CNP may have various widths, and have planar shapes apart from each other with spaces of various sizes/widths therebetween.

Figure 11A:
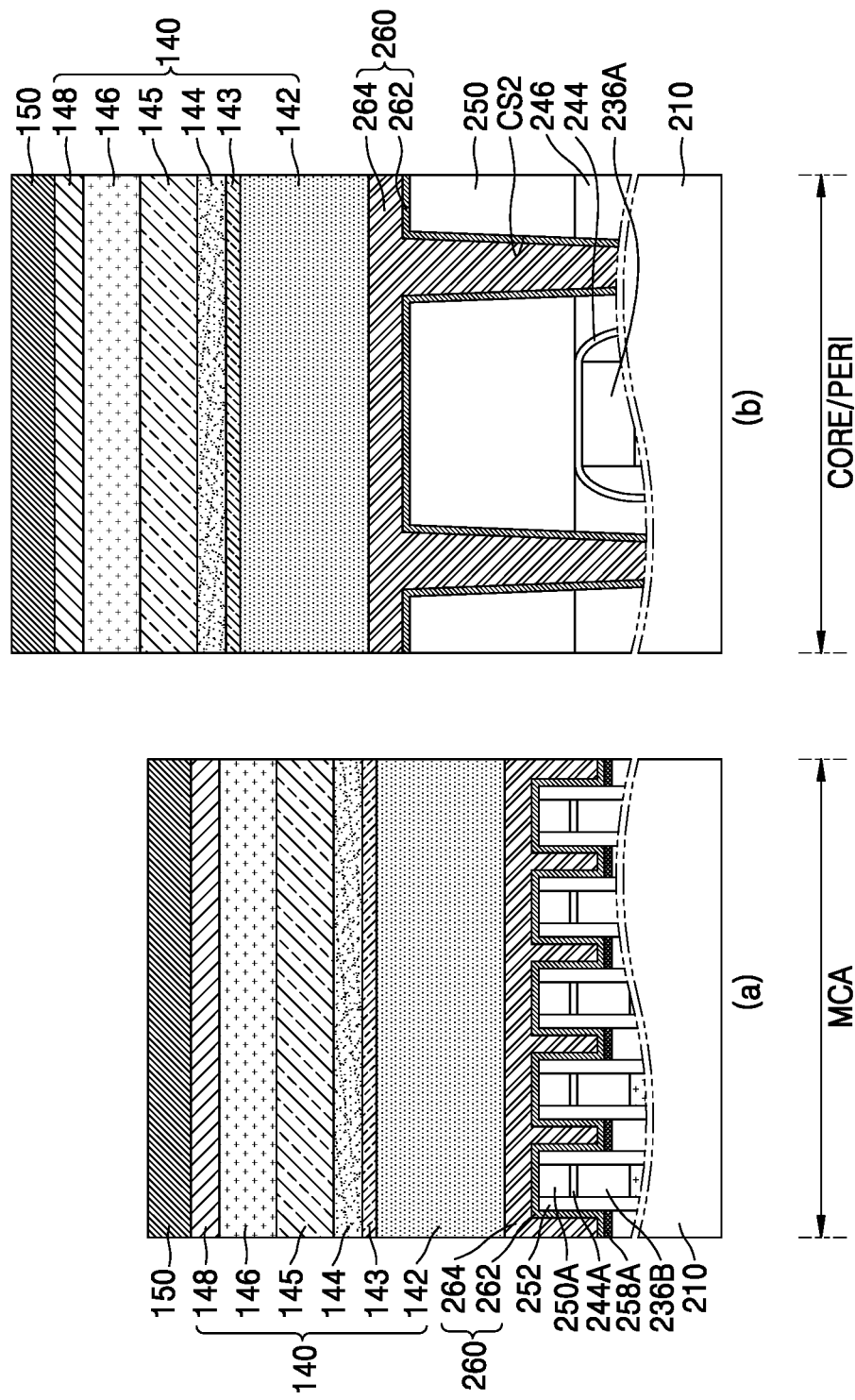
FIGS. 11A and 11B are cross-sectional views illustrated according to process sequences to describe a method of patterning a conductive layer simultaneously in a cell array area and a peripheral circuit area according to a method of manufacturing an integrated circuit device according to the technical idea of the inventive concept.
Figure 11B:
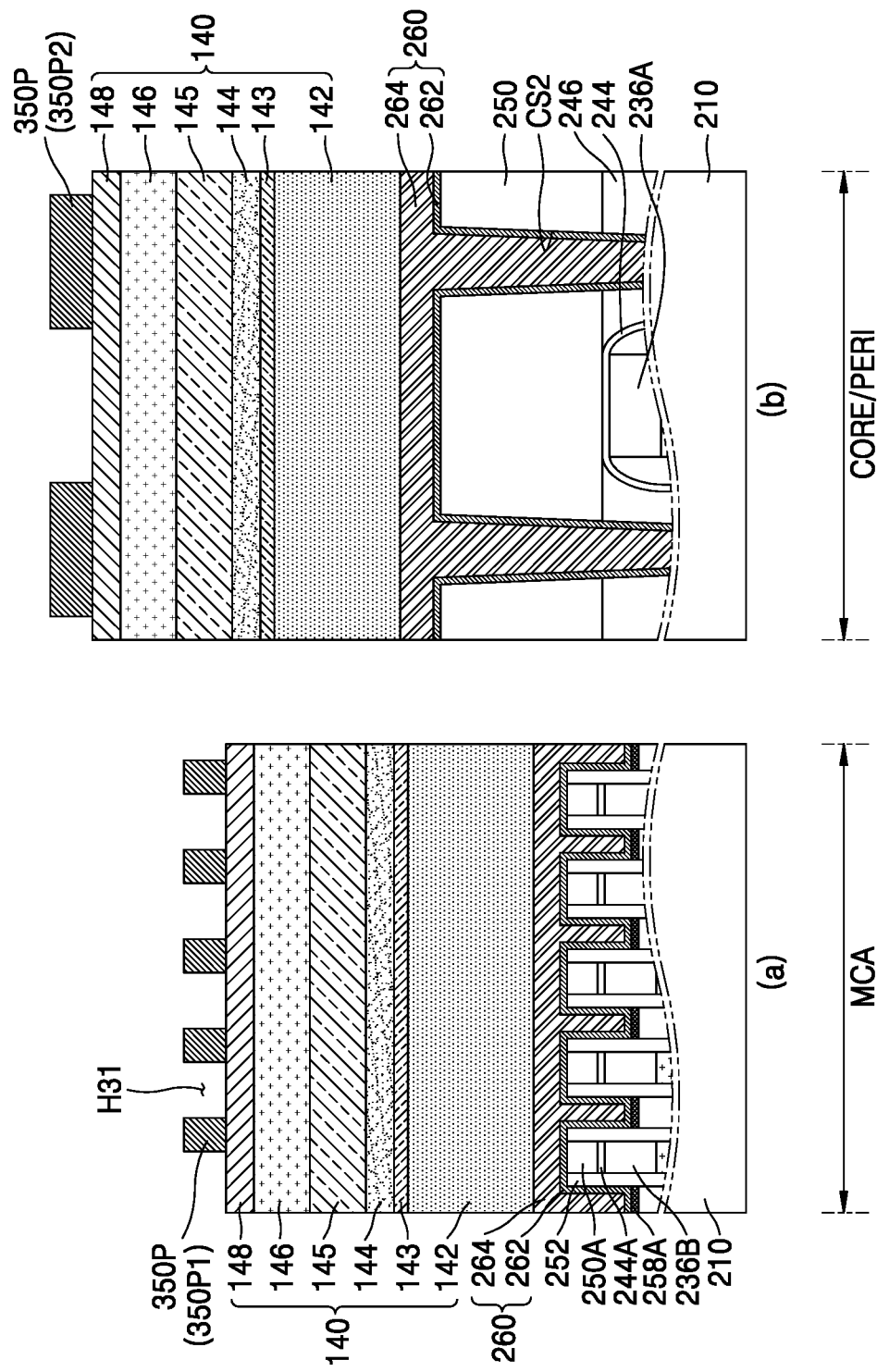

FIGS. 11A and 11B are cross-sectional views illustrated according to process sequences to describe in more detail the method of patterning the conductive layer 260 simultaneously in the cell array area MCA and the peripheral circuit area CORE/PERI according to the process described with reference to FIG. 10M. In FIGS. 11A and 11B, some of the components illustrated in FIG. 10M are omitted.

Referring to FIG. 11A, the hardmask structure 140 and the photoresist layer 150 may be sequentially formed on the conductive layer 260 in the cell array area MCA and the peripheral circuit area CORE/PERI. Detailed configurations of the hardmask structure 140 and the photoresist layer 150 are described with reference to descriptions given with reference to FIG. 3B.

Referring to FIG. 11B, in a manner similar to that described with reference to FIG. 3C, the photoresist layer 150 may be simultaneously exposed and developed in the cell array area MCA and the peripheral circuit area CORE/PERI, and from the resultant photoresist layer 150, the photoresist pattern 350P may be formed. The photoresist pattern 350P may include a first photoresist pattern 350P1 in the cell array area MCA and a second photoresist pattern 350P2 in the peripheral circuit area CORE/PERI. A planar shape of the first photoresist pattern 350P1 may have an intaglio pattern having a planar shape that is inverse to the planar shape of the plurality of conductive landing pads LP (refer to FIG. 10M) to be formed in the cell array area MCA. For example, the first photoresist pattern 350P1 may have an inverse pattern of the landing pads LP shown in FIG. 10M. A planar shape of a plurality of holes H31 formed in the first photoresist pattern 350P1 may be the same as the planar shape of the plurality of conductive landing pads LP illustrated in FIG. 8A. A planar shape of the second photoresist pattern 350P2 may have an embossed pattern that is the same as the planar shape of the plurality of conductive patterns CNP (refer to FIG. 10M) to be formed in the peripheral circuit area CORE/PERI. In example embodiments, in a process of exposing the photoresist layer 150, the EUV light (e.g., having a wavelength about 13.5 nm), the KrF excimer laser (about 248 nm), the ArF excimer laser, or $F_2$ excimer laser (about 157 nm) may be used as a light source.

Next, by using the photoresist pattern 350P as an etching mask, processes similar to those described with reference to FIGS. 3D through 3M may be performed on a resultant product of FIG. 11A. However, in this example, by etching the conductive layer 260 instead of the to-be-etched layer 130, as illustrated in FIG. 10M, the plurality of conductive landing pads LP may be formed in the cell array area MCA, and the plurality of conductive patterns CNP may be formed in the peripheral circuit area CORE/PERI.

Referring back to FIG. 10M, while the etching process for forming the plurality of conductive landing pads LP and the plurality of conductive patterns CNP is performed in the cell array area MCA and the peripheral circuit area CORE/PERI, an insulating space 270S exposing the plurality of insulating spacers 252 may be formed around each of the plurality of conductive landing pads LP in the cell array area MCA. The insulating space 270S may be filled with the insulating layer 270. In example embodiments, before the insulating space 270S is filled with the insulating layer 270, the air spacers in the plurality of insulating spacers 252 may be formed by modifying a portion of the plurality of insulating spacers 252 via the insulating spaces 270S. Next, a capacitor bottom electrode may be formed on the plurality of conductive landing pads LP in the cell array area MCA.

According to an example method of manufacturing the integrated circuit device 200 described with reference to FIGS. 10A through 10M, 11A, and 11B, in simultaneously forming the plurality of conductive landing pads LP that are in the cell array area MCA and have a relatively high pattern density and the plurality of conductive patterns CNP that are in the peripheral circuit area CORE/PERI and have a relatively low pattern density, an intaglio patterning may be used in the cell array area MCA and an embossed patterning may be used in the peripheral circuit area CORE/PERI. To this end, by using the multi-layer hardmask structure 140 including the reversible hardmask layer 145, and by using only one exposure process, patterns having different shapes and density from each other may be easily formed in the cell array area MCA and the peripheral circuit area CORE/PERI. In addition, since the intaglio patterning is used in the cell array area MCA, after a plurality of conductive landing pads LP are densely arranged at a relatively small pitch, an occurrence of a pattern defect such as the plurality of conductive landing pads LP sticking to each other may be prevented. In addition, since an embossed patterning is used in the second area AR2, the plurality of conductive patterns CNP that have various widths and are apart from each other with various spaces therebetween may be easily formed into a desired shape. As described above, according to the method of manufacturing an integrated circuit device according to example embodiments of the inventive concepts, patterns of various desired shapes and sizes may be formed in the cell array area MCA and the peripheral circuit area CORE/PERI that have different pattern densities from each other, by using one-time exposure process that is a simple and relatively low unit cost process. In addition, even when the levels of the conductive layer 260, which is a target layer to be etched, are different from each other in the cell array area MCA and the peripheral circuit area CORE/PERI, a process difficulty may not be increased, undesired skew or distribution deterioration in the plurality of conductive landing pads LP or the plurality of conductive patterns CNP may not occur, a process defect may not occur, a design freedom may be improved, and a process margin may be increased.

While the inventive concept has been particularly shown and described with reference to embodiments thereof, it will be understood that various changes in form and details may be made therein without departing from the spirit and scope of the following claims.

What is claimed is:

1. A method of forming a pattern, the method comprising:
   forming a target layer on a substrate comprising a first area and a second area;
   forming a hardmask structure comprising a plurality of hardmask layers on the target layer in the first area and the second area;
   forming a photoresist layer on the hardmask structure in the first area and the second area;
   forming a photoresist pattern by exposing and developing the photoresist layer, the photoresist pattern comprising a first photoresist pattern in the first area and a second photoresist pattern in the second area;
   forming a reversible hardmask pattern comprising a plurality of openings in the first area and the second area by transferring a shape of the photoresist pattern onto a reversible hardmask layer that is one of the plurality of hardmask layers;
   forming a gap-fill hardmask pattern by filling some of the plurality of openings formed in the first area with a gap-fill hardmask pattern material; and
   forming a feature pattern in the target layer by transferring a shape of the gap-fill hardmask pattern to the target layer in the first area and by transferring a shape of the reversible hardmask pattern to the target layer in the second area.

2. The method of claim 1, wherein
   the forming of the photoresist pattern comprises exposing the photoresist layer to an extreme ultraviolet (EUV) light pattern.

3. The method of claim 1, wherein
   a density of the feature pattern in the first area is greater than a density of the feature pattern in the second area.

4. The method of claim 1, wherein the feature pattern comprises a first pattern in the first area and a second pattern in the second area,
   the first pattern comprises a plurality of island patterns that are apart from each other and arranged in a regular order, and
   the second pattern comprises a plurality of line patterns that have different widths and different lengths and are apart from each other with different distances therebetween.

5. The method of claim 1, wherein,
   in the forming of the target layer, a first level of a top surface of a portion of the target layer in the first area is different from a second level of a top surface of a portion of the target layer in the second area.

6. The method of claim 1, wherein
   the plurality of hardmask layers comprise a main hardmask layer between the target layer and the reversible hardmask layer,
   the main hardmask layer and the reversible hardmask layer comprise different material layers from each other selected from a polysilicon layer, a silicon oxide layer, a silicon nitride layer, and an amorphous carbon layer (ACL), and the gap-fill hardmask pattern is formed by filling the gap-fill hardmask pattern material in the openings with a spin coating process.

7. A method of forming a pattern, the method comprising:
   forming a target layer on a substrate comprising a first area and a second area;
   forming a hardmask structure comprising a plurality of hardmask layers on the target layer;
   forming a photoresist layer on the hardmask structure;
   by using a one-time exposure process with the photoresist layer, forming a first photoresist pattern on the hardmask structure in the first area and a second photoresist pattern on the hardmask structure in the second area; and
   forming a first pattern and a second pattern from the target layer,
   wherein the first pattern is formed in the first area and has an inverse planar pattern with respect to the first photoresist pattern, and
   wherein the second pattern is formed in the second area and has an identical planar pattern with the second photoresist pattern.

8. The method of claim 7, wherein
   the forming of the hardmask structure comprises:
   in the first area and the second area, forming a bottom hardmask layer on the target layer;
   in the first area and the second area, forming a main hardmask layer on the bottom hardmask layer; and
   in the first area and the second area, forming a reversible hardmask layer on the main hardmask layer,
   wherein the first photoresist pattern and the second photoresist pattern are formed on the reversible hardmask layer.

9. The method of claim 8, wherein
   the bottom hardmask layer comprises a first bottom hardmask layer and a second bottom hardmask layer sequentially formed on the target layer in the first area and the second area, and
   the main hardmask layer, the first bottom hardmask layer, and the second bottom hardmask layer comprise different materials from each other.

10. The method of claim 8, wherein
    the forming of the first pattern and the second pattern comprises:
    forming a reversible hardmask pattern comprising a plurality of openings that expose some area of the main hardmask layer in the first area and the second area by etching the reversible hardmask layer by using the first photoresist pattern and the second photoresist pattern as etching masks;
    forming a gap-fill hardmask pattern by filling some of the plurality of openings formed in the first area with a gap-fill hardmask pattern material, the gap-fill hardmask pattern material not filled in some of the plurality of openings formed in the second area;

forming a first main hardmask pattern in the first area by etching a portion in the first area of the main hardmask layer by using the gap-fill hardmask pattern as an etching mask;

forming a second main hardmask pattern in the second area by etching the main hardmask layer in the second area by using a portion in the second area of the reversible hardmask pattern as an etching mask;

forming a bottom hardmask pattern in the first area and the second area by etching the bottom hardmask layer by using the first main hardmask pattern and the second main hardmask pattern as etching masks; and etching the target layer to be the first pattern and the second pattern by using the bottom hardmask pattern as an etching mask.

11. The method of claim 10, further comprising:

forming a top hardmask layer on the reversible hardmask layer in the first area and the second area after the reversible hardmask layer is formed and before the first photoresist pattern and the second photoresist pattern are formed; and etching the top hardmask layer by using the first photoresist pattern and the second photoresist pattern as etching masks before the reversible hardmask pattern is formed, wherein the reversible hardmask layer and the top hardmask layer comprise different materials from each other.

12. The method of claim 7, wherein extreme ultraviolet (EUV) light is used as a light source in the one-time exposure process.

13. The method of claim 7, wherein a density of the first pattern in the first area is greater than a density of the second pattern in the second area.

14. The method of claim 7, wherein the first pattern comprises a plurality of island patterns that are apart from each other and arranged in a regular order, and the second pattern comprises a plurality of line patterns that have different widths and different lengths and are apart from each other with different distances therebetween.

15. The method of claim 7, wherein, in the forming of the first pattern and the second pattern, the target layer is etched while a top of a portion in the first area is on a different level from a top of a portion in the second area of the target layer.

16. A method of manufacturing an integrated circuit device, the method comprising:

forming a target layer on a substrate comprising a cell array area and a peripheral circuit area;

forming a hardmask structure comprising a plurality of hardmask layers on the target layer in the cell array area and the peripheral circuit area;

forming a photoresist layer on the hardmask structure in the cell array area and the peripheral circuit area;

forming a photoresist pattern comprising a first photoresist pattern and a second photoresist pattern, the first photoresist pattern including a plurality of holes in the cell array area, the holes being apart from each other, the second photoresist pattern being in the peripheral circuit area and comprising a plurality of line patterns;

forming a reversible hardmask pattern comprising a plurality of openings by transferring a shape of the photoresist pattern onto a reversible hardmask layer that is one of the plurality of hardmask layers in the cell array area and the peripheral circuit area;

forming a gap-fill hardmask pattern in the plurality of openings by filling the plurality of openings with a gap-fill hardmask pattern material in the cell array area; and forming a plurality of island patterns from the target layer in the cell array area by transferring a shape of the gap-fill hardmask pattern to the target layer, and forming a plurality of line patterns from the target layer in the peripheral circuit area by transferring a shape of the reversible hardmask pattern to the target layer.

17. The method of claim 16, wherein a density of the plurality of island patterns is greater than a density of the plurality of line patterns.

18. The method of claim 16, wherein the forming of the photoresist pattern comprises exposing the photoresist layer to an extreme ultraviolet (EUV) light pattern.

19. The method of claim 16, wherein, in the forming of the target layer, a first level of a top surface of a portion of the target layer in the cell array area is lower than a second level of a top surface of a portion of the target layer in the peripheral circuit area.

20. An integrated circuit device formed by the method according to claim 16, the integrated circuit device comprising a plurality of bit lines formed on the substrate in the cell array area, and a gate structure formed on the substrate in the peripheral circuit area, wherein a target layer comprises a conductive layer comprising a metal, the plurality of island patterns comprise a plurality of conductive landing pads that comprise a top surface of a higher level than the plurality of bit lines in the cell array area and are electrically connected to cell active areas of the substrate via conductive plugs disposed between the bit lines, and the plurality of line patterns comprise a plurality of conductive patterns that comprise a top surface of a higher level than the gate structure.

* * * * *